United States Patent
Otaka

(10) Patent No.: US 9,583,521 B2
(45) Date of Patent: Feb. 28, 2017

(54) SOLID-STATE IMAGE PICKUP DEVICE

(71) Applicant: OLYMPUS CORPORATION, Tokyo (JP)

(72) Inventor: Toshinori Otaka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/924,873

(22) Filed: Oct. 28, 2015

(65) Prior Publication Data

US 2016/0049432 A1    Feb. 18, 2016

Related U.S. Application Data

(63) Continuation of application No. PCT/JP2014/060599, filed on Apr. 14, 2014.

(30) Foreign Application Priority Data

May 1, 2013    (JP) .................................. 2013-096434

(51) Int. Cl.
  *H04N 3/14*    (2006.01)
  *H01L 27/146*    (2006.01)
  (Continued)

(52) U.S. Cl.
  CPC .. *H01L 27/14614* (2013.01); *H01L 27/14643* (2013.01); *H04N 3/155* (2013.01);
  (Continued)

(58) Field of Classification Search
  CPC ......... H01L 27/14614; H01L 27/14643; H01L 27/14641; H04N 3/155; H04N 5/37452; H04N 5/3559
  See application file for complete search history.

(56) References Cited

U.S. PATENT DOCUMENTS

| 2010/0231767 A1 | 9/2010 | Kikuchi |
| 2012/0086095 A1 | 4/2012 | Nishiyama et al. |
| 2013/0070133 A1* | 3/2013 | Takazawa .............. H04N 5/335 348/294 |

FOREIGN PATENT DOCUMENTS

| JP | 2008-42814 A | 2/2008 |
| JP | 2010-213097 A | 9/2010 |

(Continued)

OTHER PUBLICATIONS

International Search Report dated Jun. 17, 2014, issued in counterpart application No. PCT/JP2014/060599 (4 pages).
(Continued)

*Primary Examiner* — Twyler Haskins
*Assistant Examiner* — Angel L Garces-Rivera
(74) *Attorney, Agent, or Firm* — Westerman, Hattori, Daniels & Adrian, LLP

(57) ABSTRACT

A solid-state image pickup device has a first substrate and a second substrate in which circuit elements constituting pixels are arranged. The pixel includes: a pixel section that includes a photoelectric conversion element; a ground potential controller that switches a potential to which a circuit element included in the pixel section is grounded; and a reading section that outputs a signal corresponding to the signal charge as a pixel signal output by the pixel. The pixel section includes: the photoelectric conversion element; an amplification transistor that outputs an amplification signal amplified according to the signal charge generated by the photoelectric conversion element; and a switch circuit that switches a ground of the amplification transistor according to a first output mode and a second output mode. The ground potential controller supplies a first potential in the first output mode and supplies a second potential in the second output mode.

5 Claims, 16 Drawing Sheets

(51) Int. Cl.
*H04N 5/355* (2011.01)
*H04N 5/3745* (2011.01)

(52) U.S. Cl.
CPC ....... *H04N 5/3559* (2013.01); *H04N 5/37452* (2013.01); *H01L 27/14641* (2013.01)

(56) References Cited

FOREIGN PATENT DOCUMENTS

| | | |
|---|---|---|
| JP | 2013-26713 A | 2/2013 |
| WO | 2010/116974 A1 | 10/2010 |

OTHER PUBLICATIONS

Yanget et al., "A 3MPixel Low-Noise Flexible Architecture CMOS Image Sensor", International Solid-State Circuits Conference, Digest of Technical Papers, Feb. 8, 2006, cited in the Specification and ISR (10 pages).

Aoki et al., "A Rolling-Shutter Distortion-Free 3D Stacked Image Sensor with -160dB Parasitic Light Sensitivity In-Pixel Storage Node", International Solid-State Circuits Conference, Digest of Technical Papers, Feb. 20, 2013, cited in ISR (3 pages).

\* cited by examiner

SOLID-STATE IMAGE PICKUP DEVICE

CROSS REFERENCE TO RELATED APPLICATIONS

This application is a continuation application based on a PCT Patent Application No. PCT/JP2014/060599, filed Apr. 14, 2014, whose priority is claimed on Japanese Patent Application No. 2013-096434, filed May 1, 2013, the entire content of which are hereby incorporated by reference.

BACKGROUND OF THE INVENTION

Field of the Invention

The present invention relates to a solid-state image pickup device.

Description of the Related Art

In recent years, in an image pickup device for digital still cameras, digital video cameras, endoscopes, surveillance cameras, or vehicle-mounted cameras, a high quality image that is achieved through both of acquisition of a high-sensitivity image of a dark place or subject in a screen, and acquisition of an image in which pixel saturation of a bright place or subject is suppressed is required. Therefore, in a solid-state image pickup device mounted on an image pickup apparatus, realization of a high S/N (Signal/Noise) ratio and a wide dynamic range is required.

As the solid-state image pickup device mounted on the image pickup device, there is a CMOS (Complementary Metal Oxide Semiconductor) type solid-state image pickup device (hereinafter referred to as a "CMOS image sensor"). In general, in the CMOS image-sensor, a pixel configured of four transistors that includes an amplification circuit is used. A configuration of the pixel of the CMOS image sensor is a configuration for realizing reduction of noise in an image of a dark place or subject, that is, a high S/N ratio. FIGS. 11A and 11B illustrate an example of a schematic structure and a driving timing of a pixel included in a conventional CMOS image sensor. In the following description, the pixel configured of four transistors that includes an amplification circuit as illustrated in FIG. 11A is referred to as a "4-transistor APS pixel."

The 4-transistor APS pixel 7 illustrated in FIG. 11A includes a photodiode PD that is a photoelectric conversion element, a transfer transistor MTX that transfers signal charge generated by the photodiode PD, a floating diffusion layer FD that accumulates the transferred signal charge, a reset transistor MRST that resets the transferred signal charge, an amplification transistor MA that amplifies the transferred signal charge, and a pixel selection transistor MRS for selecting the 4-transistor APS pixel 7. While the floating diffusion layer FD is a capacitor associated with a node connected to a gate terminal of the amplification transistor MA, the floating diffusion layer FD is indicated by a symbol of a capacitor so as to clearly express the floating diffusion layer FD in the schematic configuration of the 4-transistor AFS pixel 7 illustrated in FIG. 11A.

The 4-transistor APS pixel 7 outputs a reset signal when reset, and a pixel signal corresponding to signal charge generated through photoelectric conversion of incident light by the photodiode PD to a pixel output signal terminal OUT. In this case, a signal amplified by a source follower circuit, which includes the amplification transistor MA and a constant current source ICOL provided in a vertical signal line COL, is output to the pixel output signal terminal OUT.

Here, the driving timing of the 4-transistor APS pixel 7 will be described with reference to FIG. 11B. First, at time t1, a pixel reset signal RST becomes at a "High" level such that a reset transistor MRST becomes in an ON state. Accordingly, the floating diffusion layer FD is reset, and a potential of the floating diffusion layer FD becomes at a potential that is reduced by a threshold voltage of the reset transistor MRST from a power supply VDD. Further, a pixel selection signal RS becomes at a "High" level such that the pixel selection transistor MRS becomes in an ON state. Accordingly, the potential of the pixel output signal terminal OUT becomes a potential close to the power supply VDD corresponding to the potential of the floating diffusion layer FD.

Subsequently, at time t2, the pixel reset signal RST becomes at a "Low" level such that the reset transistor MRST becomes in an OFF state, and an operation of resetting the floating diffusion layer FD to a potential of the power supply VDD ends. A period in which the potential of the pixel output signal terminal OUT is stabilized to the reset potential (a period to time t3 in FIG. 11B) starts. During the period in which the potential of the pixel output signal terminal OUT is stabilized to the reset potential, the potential of the pixel output signal terminal OUT decreases by a reset noise component of the 4-transistor APS pixel 7 and is stabilized to a potential of a reset potential VOUT(R7). The reset potential VOUT(R7) is a potential decreased by the amount of the noise generated by the 4-transistor APS pixel 7 in comparison with the potential of the power supply VDD.

Subsequently, at time t3, a pixel transfer signal TX becomes at a "High" level such that the transfer transistor MTX becomes in an ON state, and transfers the signal charge generated by the photodiode PD to the floating diffusion layer FD. Accordingly, the potential of the floating diffusion layer FD becomes at a potential corresponding to the signal charge generated by the photodiode PD due to exposure. In this case, since the pixel selection signal RS is at a "High" level, the potential of the pixel output signal terminal OUT decreases by the amount of charge corresponding to the signal charge transferred to the floating diffusion layer FD.

Subsequently, at time t4, the pixel transfer signal TX becomes at a "Low" level such that the transfer transistor MTX becomes in an OFF state, and an operation of transferring the signal charge generated by the photodiode PD to the floating diffusion layer FD ends. A period in which the potential of the pixel output signal terminal OUT is stabilized to the signal potential (a period, to time t5 in FIG. 11B) starts. During the period in which the potential of the pixel output signal terminal OUT is stabilized to a signal potential the potential of the pixel output signal terminal OUT decreases under an influence when the transfer transistor MTX is OFF, and is stabilized to the potential of the signal potential VOUT(S7). The signal potential VOUT(S7) is a potential that depends on parasitic capacitance or the like due to a transfer path for each signal.

Subsequently, at time t5, the pixel selection signal RS becomes at a "Low" level such that the pixel selection transistor MRS becomes in an OFF state. Accordingly, the potential of the pixel output signal terminal OUT becomes a potential which does not depend on the potential of the floating diffusion layer FD.

Thus, the 4-transistor APS pixel 7 outputs the reset signal at the reset potential VOUT(R7) when reset, and the pixel signal at the signal potential VOUT(S7) corresponding to the signal charge generated through photoelectric conversion of incident light by the photodiode PD to the pixel output signal terminal OUT.

Here, a conversion gain of the signal charge generated by the photodiode PD transferred to the floating diffusion layer FD at time t3 will be described. When the pixel transfer signal TX is set to a "High" level such that the transfer transistor MTX becomes in an ON state, the signal charge generated by the photodiode PD is transferred to the floating diffusion layer FD based on a slope of a potential provided in advance. As a result, the potential in the floating diffusion layer FD changes according to Equation (1) below.

$$\Delta V_{FD} = Q_{FD}/C_{FD} = qN_{ph}/C_{FD} \quad (1)$$

In Equation (1) above, $\Delta V_{FD}$ indicated the amount of variation in the potential in the floating diffusion layer FD. $Q_{PD}$ indicates the signal charge generated by the photodiode PD, $C_{FD}$ indicates capacitance of the floating diffusion laser FD, q indicates elementary charge $1.6 \times 10^{-19}$[C], and $N_{ph}$ indicates the number of signal charges generated by the photodiode PD.

From Equation (1) above, a conversion gain C. G. which can be defined as voltage variation with respect to one charge can be represented by Equation (2) below.

$$C. G. = qN_{ph}/C_{FD} \cdot 1/N_{ph} = q/C_{FD} \times 1/C_{FD} \quad (2)$$

It can be seen from Equation (2) above that the conversion gain C. G. is inversely proportional to the capacitance $C_{FD}$ of the floating diffusion layer FD. Therefore, in the CMOS image sensor, it is possible to realize a high S/N ratio by fabricating the floating diffusion layer FD with small capacitance $C_{FD}$, and to acquire a high-sensitivity image even in photographing a dark place or subject using the image pickup device.

However, the CMOS image sensor is different from a CCD (Charge Coupled Device) solid-state image pickup device that is one solid-state image pickup device mounted on an image pickup apparatus, and an operation at a low supply voltage also is one characteristic. In general, 3 to 3.3 [V] are used as a power supply voltage of the CMOS image sensor.

However, the power supply voltage of the CMOS image sensor of 3 to 3.3 [V] limits a voltage range that can be used for the floating diffusion layer FD. Further, in order to smoothly transfer the signal charge from the photodiode FD to the floating diffusion layer FD even in a short time, a certain potential difference is required between the potential of the photodiode PD and the potential of the floating diffusion layer FD, but since the supply voltage of the CMOS image sensor is low, an upper limit of the amount of variation $\Delta V_{FD}$ in the potential in the floating diffusion layer FD is limited. Since the amount of variation $\Delta V_{FD}$ of the potential in the floating diffusion layer FD is an element for determining a saturation characteristic of the pixel, the amount of variation affects the wide dynamic range of the CMOS image sensor.

Therefore, in the conventional CMOS image sensor, there is a trade-off relationship between the capacitance $C_{FD}$ of the floating diffusion layer FD and the number $N_{ph}$ of signal charges generated by the photodiode FD. For example, when the capacitance $C_{FD}$ of the floating diffusion layer FD decreases in order to realize a high S/N ratio of the CMOS image sensor, the conversion gain C. G is improved and high, sensitivity is achieved, but the number $N_{ph}$ of signal charges generated by the photodiode FD that can be stored in the floating diffusion layer FD is reduced in proportion to the capacitance $C_{FD}$ of the floating diffusion layer FD, and the pixel is saturated with a small number $N_{ph}$ of signal charges. Conversely when the capacitance $C_{FD}$ of the floating diffusion layer FD increases in order to realize a wide dynamic range of the CMOS image sensor, a large manner $N_{ph}$ of signal charges are used and the pixel is saturated, but since the conversion gain C. G. is reduced in inverse proportion to the capacitance $C_{FD}$ of the floating diffusion layer FD, the sensitivity is degraded.

Therefore, in the conventional CMOS image sensor including the 4-transistor APS pixel 7 having the configuration illustrated in FIG. 11A, it is not possible to achieve both of a high S/N ratio and a wide dynamic range and to realize an image pickup device in which both of acquisition of a high-sensitivity image in photography in a dark place and acquisition of a high-quality image in which the saturation of the pixel in photography in a bright place is suppressed are achieved. Therefore, in the conventional CMOS image sensor, performance compromised to some extent so as to balance the S/N ratio and the dynamic range is only obtained.

As a technology for solving such problems, for example, "A 3MPixel Low-Noise Flexible Architecture CMOS Image Sensor," by Jungwook Yang, et al., ISSCC Dig. Tech. Papers, February 2006 (hereinafter referred to as Non-Patent Literature 1) discloses a configuration of a pixel that can achieve both a high S/N ratio and a wide dynamic range, FIGS. 12A, 12B, and 12C are diagrams illustrating an example of a schematic configuration and a driving timing of the pixel included in a conventional CMOS image sensor, which is disclosed in Non-Patent literature 1. in the following description, the pixel having the configuration as illustrated in FIG. 12A is referred to as a "low-noise flexible pixel." In FIG. 12A, the same components as those of the 4-transistor APS pixel 7 illustrated in FIG. 11A are denoted with the same reference numerals.

The low-noise flexible pixel 8 illustrated in FIG. 12A includes a photodiode PD, a floating diffusion layer FD, a reset transistor MRST, an amplification transistor MA, a pixel selection transistor MRS, and a feedback capacitor CFB. While the floating diffusion layer FD is a capacitor associated with a node connected to agate terminal of the amplification transistor MA, the floating diffusion layer FD is indicated by a symbol of a capacitor so as to clearly express the floating diffusion layer FD in the schematic configuration of the low-noise flexible pixel 8 illustrated in FIG. 12A.

The low-noise flexible pixel 8 is a pixel that does not include the transfer transistor MTX included in the 4-transistor APS pixel 7 illustrated in FIG. 11A, that is, is based on a pixel including three transistors. Since the pixel including three transistors can deal with more signal charges, the pixel has a configuration For suppressing the saturation of the pixel, that is, realizing a wide dynamic range on the assumption that a bright place or subject is photographed by the image pickup device. However, since a conversion gain C. G. of the pixel including three transistors is inversely proportional to the capacitance of the photodiode PD that is generally greater than the capacitance of the floating diffusion layer FD, there is a problem in which the sensitivity is degraded. Therefore, in the low-noise flexible pixel 8, by including two types of amplification, modes (reading modes), both of a wide dynamic range and a high S/N ratio are achieved.

Here, driving timings in respective reading modes in a low-noise flexible pixel 8 will be described with reference to FIGS. 12B and 12C. Source follower reading (drain-grounded reading) for realizing a wide dynamic range illustrated in FIG. 12B will first be described. In the source follower reading, first, at time t1, the switch S1 is in an ON state (at a "High" level), the switch S2 becomes in an OFF state (at a "Low" level), the constant current source ICOL1 becomes in an OFF state, and the constant current source ICOL2 becomes in an ON state. Accordingly, the potential of the vertical signal line COL1 (the potential of the pixel output signal terminal OUT1) becomes a ground potential VOUT(V1) of the potential V1.

Subsequently at time t2, the pixel selection signal RS becomes at a "High" level, and accordingly, the pixel selection transistor MRS becomes in an ON state. Accordingly, a drain terminal of the amplification transistor MA is grounded to the ground potential VOUT1(V1), and the amplification transistor MA and the constant current source ICOL2 provided in the vertical signal line COL2 constitute a source follower circuit. A pixel signal of a signal potential VOUT2(S8) corresponding to the signal charge (potential of the Foaling diffusion layer FD) generated by the photodiode PD, which is input to the gate terminal of the amplification transistor MA, is output to a pixel output signal terminal OUT2.

Subsequently, at time t3, the pixel reset signal RST becomes at a "High" level and accordingly, the reset transistor MRST becomes in an ON state. Accordingly, the potential (potential of the floating diffusion layer FD) of the gate terminal of the amplification transistor MA is reset, and a reset signal of the reset potential VOUT2 (R8) when the low-noise flexible pixel 8 is reset is output to the pixel output signal terminal OUT2.

Subsequently, at time t4, the pixel reset signal RST becomes at a "Low" level, and accordingly, the reset transistor MRST becomes in an OFF state. The pixel selection signal RS becomes at a "Low" level, and the pixel selection transistor MRS becomes in an OFF state. Accordingly, the potential of the pixel output signal terminal OUT2 becomes a potential that does not depend on the potential (potential of the floating diffusion layer FD) of the gate terminal of the amplification transistor MA.

Subsequently, at time t5, the switch S1 becomes in an OFF state (at a "Low" level), and source follower reading in the low-noise flexible pixel 8 (drain-grounded reading) ends.

Next, common source reading (source-grounded reading) for realizing a high S/N ratio illustrated in FIG. 12C will be described. In the common source reading, first, at time t1, the switch S1 is in an OFF state (at a "Low" level), the switch S2 becomes in an ON state (at a "High" level), the constant current source ICOL1 becomes in an ON state, and the constant current source ICOL2 becomes in an OFF state. Accordingly, the potential of the vertical signal line COL2 (the potential of the pixel output signal terminal OUT2) becomes the ground potential VOUT2 (V2) of the potential V2.

Subsequently, at time t2, the pixel selection signal RS becomes at a "High" level, and accordingly, the pixel selection transistor MRS becomes in the ON state. Accordingly, the amplification transistor MA and the feedback capacitor CFB constitute a charge amplifier circuit. This charge amplifier circuit is an inversion amplification circuit having an amplification factor corresponding to a capacitance ratio between the feedback capacitor CFB and the capacitance $C_{FD}$ of the floating diffusion layer. The potential of the potential V2 is a potential required for operating the charge amplifier circuit and corresponds to a potential tor depleting the photodiode PD. A pixel signal of a signal potential VOUT1(S8) corresponding to the signal charge (potential of the floating diffusion layer FD) generated by the photodiode PD, which is amplified by the charge amplifier circuit, is output to the pixel output signal terminal OUT1.

Subsequently, at time t3, the pixel reset signal RST becomes at a "High" level, and accordingly, the reset transistor MRST becomes in the ON state. Accordingly, the signal charge generated by the photodiode PD (the potential of the floating diffusion layer FD) is reset, and a reset signal of a reset potential VOUT1(R8) when the low-noise flexible pixel 8 is reset is output to the pixel output signal terminal OUT1.

Subsequently, at time t4, the pixel reset signal RST becomes at a "Low" level, and accordingly, the reset transistor MRST becomes in an OFF state. The pixel selection signal RS becomes at a "Low" level, and accordingly, the pixel selection transistor MRS becomes in an OFF state. Accordingly, the potential of the pixel output signal terminal OUT1 becomes a potential that does not depend on the signal charge generated by the photodiode PD (the potential of the floating diffusion layer FD).

Subsequently, at time t5, the switch S2 becomes in an OFF state (at a "Low" level), and the common source reading in the low-noise flexible pixel 8 (source-grounded reading) ends.

Thus, in the low-noise flexible pixel 8 disclosed in Non-Patent Literature 1, two types of reading modes including the source follower reading (drain-grounded reading) and the common source reading (source-grounded reading) are included, and these reading modes are switched for each screen to achieve both of the wide dynamic range and the high S/N ratio.

Further, in a recent CMOS image sensor, in order to cope with mufti-functionality and miniaturization, a variety of functional circuits as well as pixels are incorporated to cope with a SOC (System On Chip) that realizes the multi-functionality. In the CMOS image sensor coping with the SOC, a chip-stacking technology in which the CMOS image sensor is physically divided into a first substrate in which pixels including photoelectric conversion elements are formed, and a second substrate in which a functional circuit is formed, which are separately fabricated, and the substrates are laminated to obtain one CMOS image sensor has also been used.

By physically dividing the pixel and the functional circuit of the CMOS image sensor, it is possible to fabricate respective substrates through a fabrication process most appropriate for required performance, and to greatly improve image pickup performance or functionality of the CMOS image sensor. Further, by physically dividing the pixel and the functional circuit of the CMOS image sensor, it is possible to reduce the respective substrate sizes, and thus, reduce a chip area (mounting area) of the CMOS image sensor, that is, to miniaturize the CMOS image sensor. Expansion into a new application use can also be realized.

In the chip-stacking technology, the first substrate and the second substrate that have been fabricated separately are electrically connected to each other by a connection electrode. In the CMOS image sensor corresponding to the SOC, the connection electrode is provided in each pixel formed in the first substrate and bonded to a corresponding connection electrode provided on the second substrate.

However, as can be seen from the configuration of the pixel illustrated in FIG. 12A, it is necessary for the low-noise flexible pixel 8 to include the two output terminals including the pixel output signal terminal OUT1 and the pixel output signal terminal OUT2 corresponding to the respective reading modes. That is, when the CMOS image sensor including the low-noise flexible pixel 8 is divided into the first substrate and the second substrate so as to cope with the SOC, two connection electrodes for connecting the respective substrates are required tor each pixel. In the chip-stacking technology, there are various technologies for a structure of the connection electrode or bonding portions for laminating the respective substrates, and a bonding method, but since previously fabricated substrates are laminated and bonded, reducing a size of the connection electrode or a distance between the connection electrodes is not easy in a recent miniaturization technology. Therefore, in the CMOS image sensor including the low-noise flexible pixel 8, it is difficult to cope with the SOC.

Therefore, for example, "A Rolling-Shutter Distortion-Free 3D Stacked Image Sensor with −160 dB Parasitic Light Sensitivity In-Pixel Storage Node," by J. Aoki, et al., ISSCC Dig. Tech. Papers, February 2013 (hereinafter referred to as Non-Patent Literature 2) discloses a technology for reducing the number of connection electrodes in a CMOS image sensor formed with a first substrate and a second substrate. FIG. 13 is a diagram illustrating a schematic configuration of a pixel configured with divided substrates in a conventional CMOS image sensor, which is disclosed in Non-Patent Literature 2. In the following description, a pixel having a configuration as illustrated in FIG. 13 is referred to as a "stacked low image distortion pixels." In FIG. 13, the same components as those of the pixels having the configurations illustrated in FIGS. 11A and 12A are denoted with the same reference numerals.

In the stacked low image distortion pixel 9 illustrated in FIG. 13, a pixel circuit 91 formed in a first substrate and a pixel signal reading circuit 92 formed in a second substrate are bonded by a connection electrode 93. In the stacked low image distortion pixel 9, one connection electrode is shared by four pixels, that is, the number of connection electrodes is ¼ of the number of pixels. In the stacked low image distortion pixel 9, by transferring signal charge generated by respective photodiodes PD-1 to PD-4 included in the pixel circuit 91 to corresponding analog memories CSH-1 to CSH-4, distortion of an image can be suppressed.

SUMMARY OF THE INVENTION

According to a first aspect of the present invention, in a solid-state image pickup device, a first substrate and a second substrate in which circuit elements constituting pixels are arranged are electrically connected to each other by a connection portion. The pixel includes a pixel section that is arranged in the first substrate and includes a photoelectric conversion element that generates signal charge corresponding to incident light; a ground potential controller that is arranged in the first substrate and switches a potential to which a circuit element included in the pixel section is grounded; and a reading section that is arranged in the second substrate and outputs a signal corresponding to the signal charge generated by the photoelectric conversion element that is output from the pixel section, as a pixel signal output by the pixel. The pixel section includes the photoelectric conversion element; an amplification transistor that outputs an amplification signal amplified according to the signal charge generated by the photoelectric conversion element; and a switch circuit that switches a ground of the amplification transistor according to a first output mode in which the amplification signal amplified by the amplification transistor being source-grounded is output to the reading section, and a second output mode in which the amplification signal amplified by the amplification transistor being drain-grounded is output to the reading section. The ground potential controller supplies a first potential to the amplification transistor in the first output mode and supplies a second potential to the amplification transistor in the second output mode to switch a potential to which the amplification, transistor is grounded.

According to a second aspect of the present invention, in the solid-state image pickup device according to the first aspect, a plurality of pixel sections may be arranged in a two-dimensional matrix form, a predetermined number of the pixel units may constitute each of a plurality of pixel and groups, and the ground potential controller may include a first power supply that outputs the first potential; a second power supply that outputs the second potential; a plurality of first ground potential supply transistors each of which corresponds to each pixel unit group and supplies the first potential output by the first power supply to each amplification transistor included in each of the plurality of pixel units included in the corresponding pixel unit group; and a plurality of second ground potential supply transistors each of which corresponds to each pixel and group and supplies the second potential output by the second power supply to each amplification transistor included in each of the plurality of pixel units included in the corresponding pixel unit group.

According to a third aspect of the present invention, in the solid-state image pickup device according to the second aspect, each pixel section group may include a plurality of pixel sections arranged in the same row.

According to a fourth aspect of the present invention, in the solid-state image pickup device according to the first aspect, the reading section may sum the amplification signal output from the pixel section in the first output mode and the amplification signal output from the pixel section in the second output mode.

According to a fifth aspect of the present invention, a solid-state image pickup device includes a pixel section including a photoelectric conversion element that generates signal charge corresponding to incident light; a ground potential controller that switches a potential to which a circuit element included in the pixel section is grounded; and a reading section that outputs a signal corresponding to the signal charge generated by the photoelectric-conversion element that is output from the pixel section, as a pixel signal. The pixel section includes the photoelectric conversion element; an amplification transistor that outputs an amplification signal amplified according to the signal charge generated by the photoelectric conversion element; and a switch circuit that switches a ground of the amplification transistor according to a first output mode in which the amplification signal amplified by the amplification transistor being source-grounded is output to the reading section, and a second output mode in which the amplification signal amplified by the amplification transistor being drain-grounded is output to the reading section. The ground potential controller supplies a first potential to the amplification transistor in the first output mode and supplies a second potential to the amplification transistor in the second output mode to switch a potential to which the amplification transistor is grounded, and the reading section sums the amplification signal output from the pixel section in the first output mode and the amplification signal output from the pixel section in the second output mode.

DETAILED DESCRIPTION OF THE INVENTION

Hereinafter, embodiments of the present invention will be described with reference to the drawings. The following description includes specific details for the purposes of illustration. However, it can be understood by those skilled in the art that various modifications of details to be described below do not depart from the scope of the present invention. Accordingly, exemplary embodiments of the present invention to be described below will be described without causing loss of generality and without any limitation with respect to the claimed invention.

Figure 1:
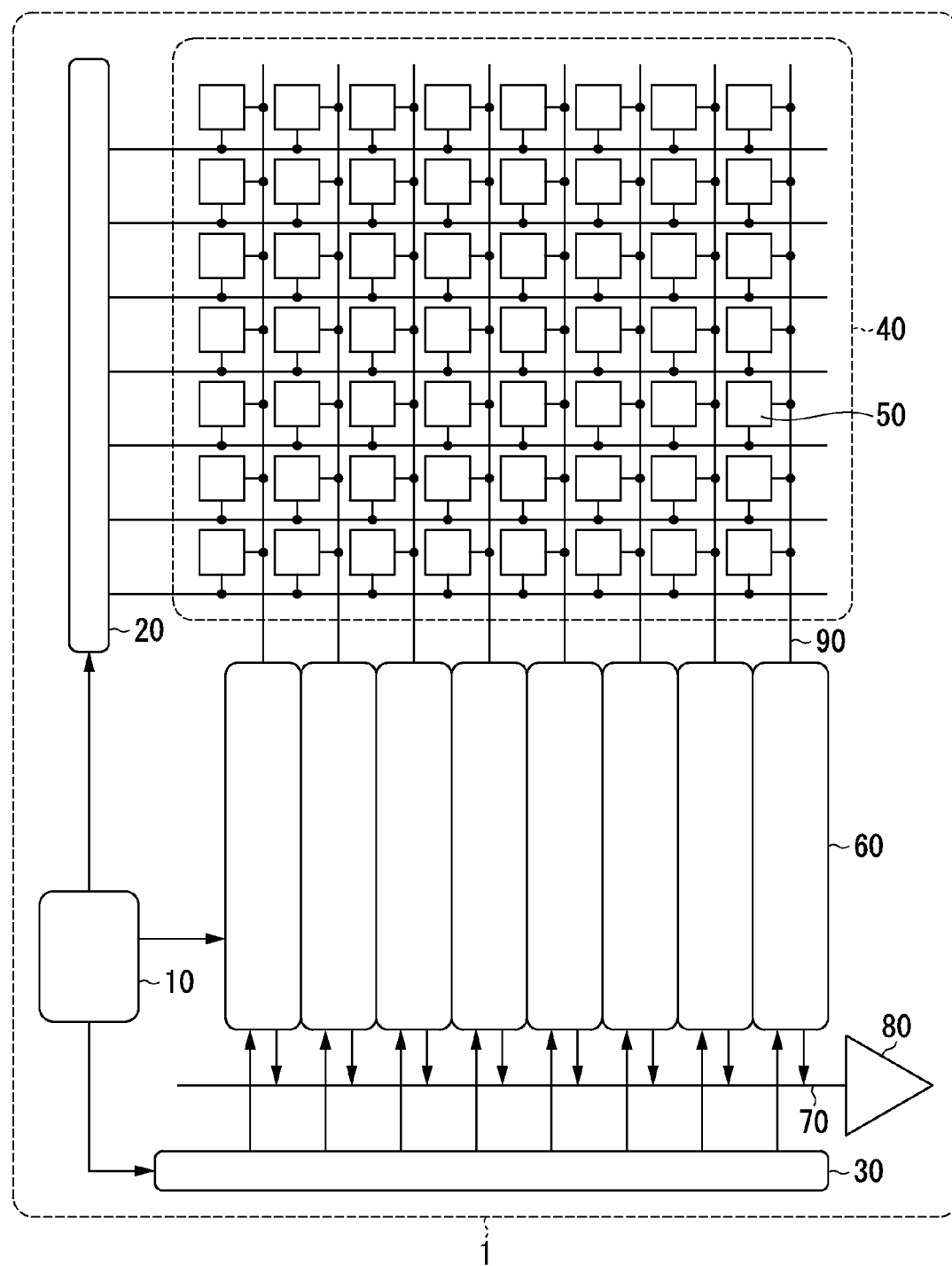
FIG. 1 is a block diagram, illustrating a schematic configuration of a solid-state image pickup device according to an embodiment of the present invention.

FIG. 1 is a block diagram illustrating a schematic configuration of a solid-state image pickup device according to this embodiment. In FIG. 1, the solid-state image pickup device 1 includes a control circuit 10, a vertical scanning circuit 20, a horizontal scanning circuit 30, a pixel array unit 40 including a plurality of unit pixels 50, a column signal processing circuit 60, and an output amplifier 80. In the solid-state image pickup device 1 illustrated in FIG. 1, a plurality of unit pixels 50 are an example of the pixel array unit 40 two-dimensionally arranged in 7 rows and 8 columns.

The control circuit 10 controls the vertical scanning circuit 20, the horizontal scanning circuit 30, and the column signal processing circuits 60.

The vertical scanning circuit 20 controls the respective unit pixels 50 in the pixel array unit 40 under the control of the control circuit 10 so that pixel signals of the unit pixels 50 are output to a vertical signal line 90. The vertical scanning circuit 20 outputs a control signal for controlling the unit pixels 50 to each row of the unit pixel 50 included in the pixel array unit 40. Detailed description of a method of controlling the unit pixels 50 using the vertical scanning circuit 20 will be described below.

Each of the unit pixels 50 in the pixel array unit 40 converts incident subject light into the pixel signal, and outputs the pixel signal corresponding to the incident subject light to the vertical signal line 90 in response to the control signal input from the vertical scanning circuit 20. Circuit elements constituting each unit pixel 50 are arranged in a first substrate and a second substrate, and the first substrate and the second substrate are connected to each other in the unit pixel 50. Detailed description of this unit pixel 50 will be described below.

The column signal processing circuit 60 is a processing circuit for, for example, CDS (Correlated Double Sampling), signal amplification, or AD conversion that is arranged in each column of the pixel array unit 40, and performs circuit processing such as noise suppression on the pixel signal output from the unit pixel 50 of each column to each vertical signal line 90 under the control of the control circuit 10. The column signal processing circuit 60 outputs an output signal obtained by processing the pixel signal to the horizontal signal line 70 under the control of the horizontal scanning circuit 30.

The horizontal scanning circuit 30 sequentially reads the output signal after processing output from the column signal processing circuit 60 arranged in each column to the horizontal signal line 70. The output signal from the column signal processing circuits 60 that has been read to the horizontal signal line 70 is output to the outside of the solid-state image pickup device 1 via the output amplifier 80.

Figure 2:
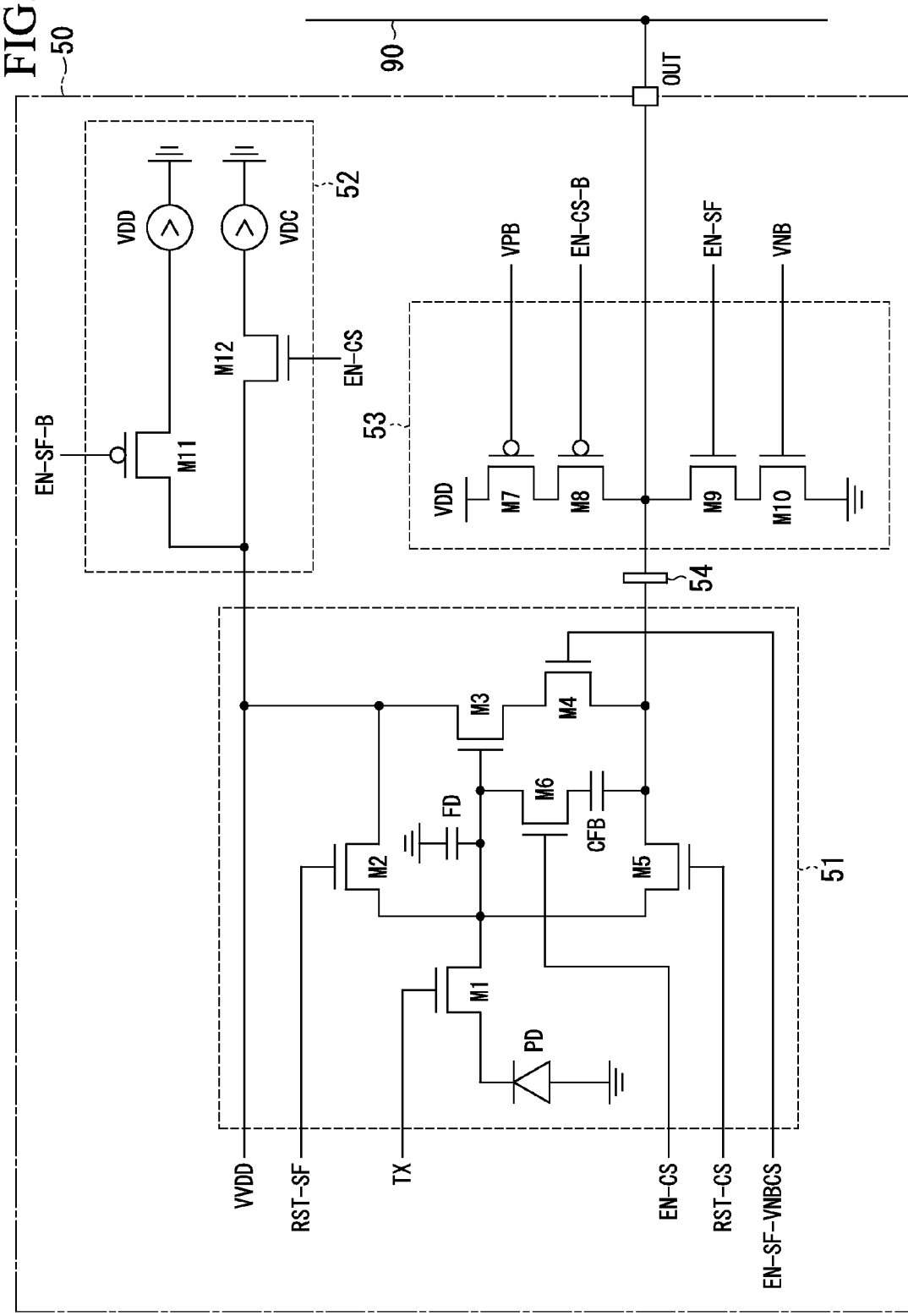
FIG. 2 is a circuit diagram illustrating a schematic configuration of a unit pixel in a pixel array unit of the solid-state image pickup device of this embodiment.

Next, the unit pixel 50 included in the pixel array unit 40 of the solid-state image pickup device 1 of this embodiment will be described. FIG. 2 is a circuit diagram illustrating a schematic configuration of the unit pixel 50 in the pixel array unit 40 of the solid-state image pickup device 1 of this embodiment. FIG. 2 illustrates one unit pixel 50. The unit pixel 50 converts the incident subject light into the pixel signal and outputs the pixel signal from a pixel output signal terminal OUT to the vertical signal line 90. In FIG. 2, the unit pixel 50 includes a pixel section 51, a ground potential controller 52, and a reading section 53.

In the unit pixel 50, respective components in each unit pixel 50 are divided and arranged in the first substrate and the second substrate. The components arranged in the first substrate and the components arranged in the second substrate are connected to each other by an inter-substrate connection portion 54. FIG. 2 illustrates the unit pixel 50 having a configuration in which the pixel section 51 and the ground potential controller 52 are arranged in the first substrate, the reading section 53 is arranged in the second substrate, and the first pixel section 51 arranged in the first substrate and the reading section 53 arranged in the second substrate are connected to each other by the inter-substrate connection portion 54.

The unit pixel 50 outputs the pixel signal corresponding to the incident subject light in two output modes including a first output mode for outputting a pixel signal with a wide dynamic range, and a second output mode for outputting a pixel signal with a high S/N ratio in response to the control signal input from the vertical scanning circuit 20. Detailed description of an operation when the unit pixel 50 outputs the pixel signal in each output mode will be given below.

The pixel section 51 outputs a signal corresponding to the signal charge generated by the photodiode PD to the reading section 53 arranged in the second substrate via the inter-substrate connection portion 54 in response to the control signal input from the vertical scanning circuit 20. The pixel section 51 includes the photodiode PD, a transfer transistor M1, a floating diffusion layer FD, a first-mode reset transistor M2, an amplification transistor M3, a second-mode cascode transistor M4, a second-mode reset transistor M5, a second-mode feedback capacitor CFB, and a second-mode feedback capacitor control transistor M6.

The photodiode PD is a photoelectric conversion element that generates signal charge corresponding to the incident subject light.

The transfer transistor M1 transfers the signal charge generated by the photodiode PD to the floating diffusion layer FD in response to a pixel transfer signal TX input from the vertical scanning circuit 20.

The floating diffusion layer FD is a capacitor associated with a node connected to a gate terminal of the amplification transistor M3, which accumulates the signal charge transferred by the transfer transistor M1. In FIG. 2, the floating diffusion layer FD is indicated by a symbol of a capacitor so as to clearly express the floating diffusion layer FD.

The first-mode reset transistor M2 resets the signal charge accumulated in the floating diffusion layer FD in response to a first-mode pixel reset signal RST-SF input from the vertical scanning circuit 20 in the first output mode.

The amplification transistor M3 amplifies the signal charge accumulated in the floating diffusion layer FD.

The second-mode cascode transistor M4 constitutes a cascode circuit (common gate-grounded amplification circuit) in the unit pixel 50 based on a switching signal EN-SP-VNBCS input from the vertical scanning circuit 20 in the second output mode.

The second-mode reset transistor MS resets the signal charge accumulated in the floating diffusion layer FD in response to a second-mode pixel reset signal RST-CS input from the vertical scanning circuit 20 in the second output mode.

The second-mode feedback capacitor CFB is a feedback capacitor configured in the second output mode.

The second-mode feedback capacitor control transistor M6 controls the second-mode feedback capacitor CFB in response to a second-mode enable signal EN-CS input from the vertical scanning circuit 20 in the second output mode.

It is preferable for the second-mode feedback capacitor CFB to have small capacitance from the viewpoint of a high amplification factor of the signal charge in the second output mode. This is because the amplification factor $A_{CL}$ of the signal charge in the second output mode is expressed by Equation (3) below.

$$A_{CL}=C_{PD}/C_{FB} \qquad (3)$$

In Equation (3) above, $C_{PD}$ is capacitance of the photodiode PD, and $C_{FB}$ is capacitance of the second-mode feedback capacitor CFB.

Figure 11A:
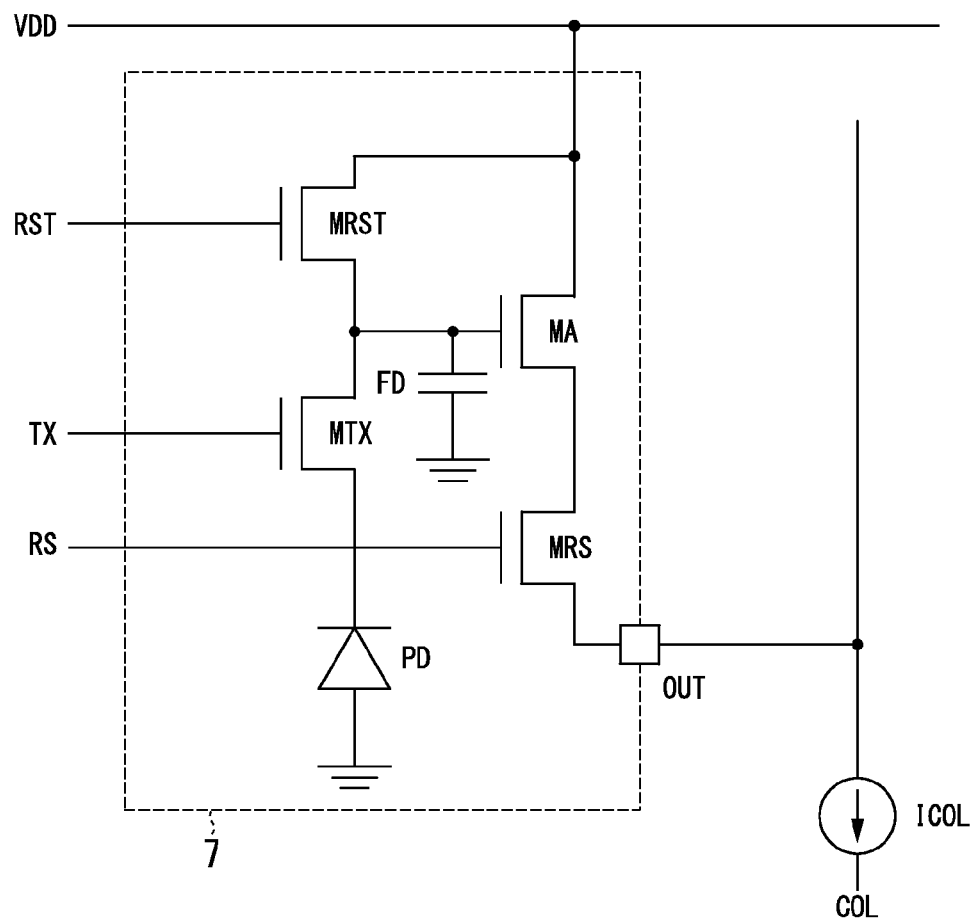
FIG. 11A is a diagram illustrating an example of a schematic configuration of a pixel included in a conventional CMOS image sensor.
Figure 11B:
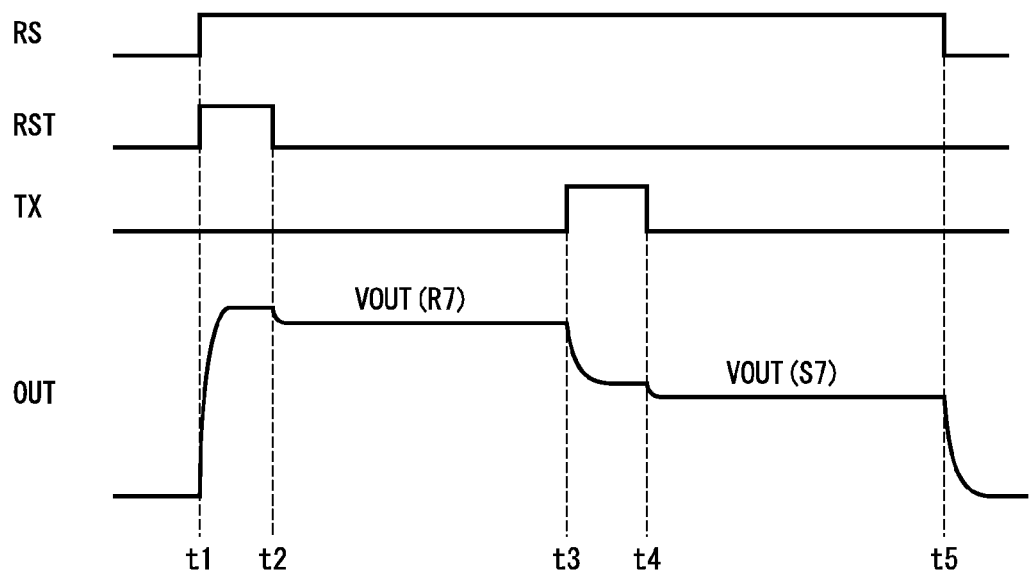
FIG. 11B is a diagram, illustrating an example of driving timings of the pixel included in the conventional CMOS image sensor.
Figure 12A:
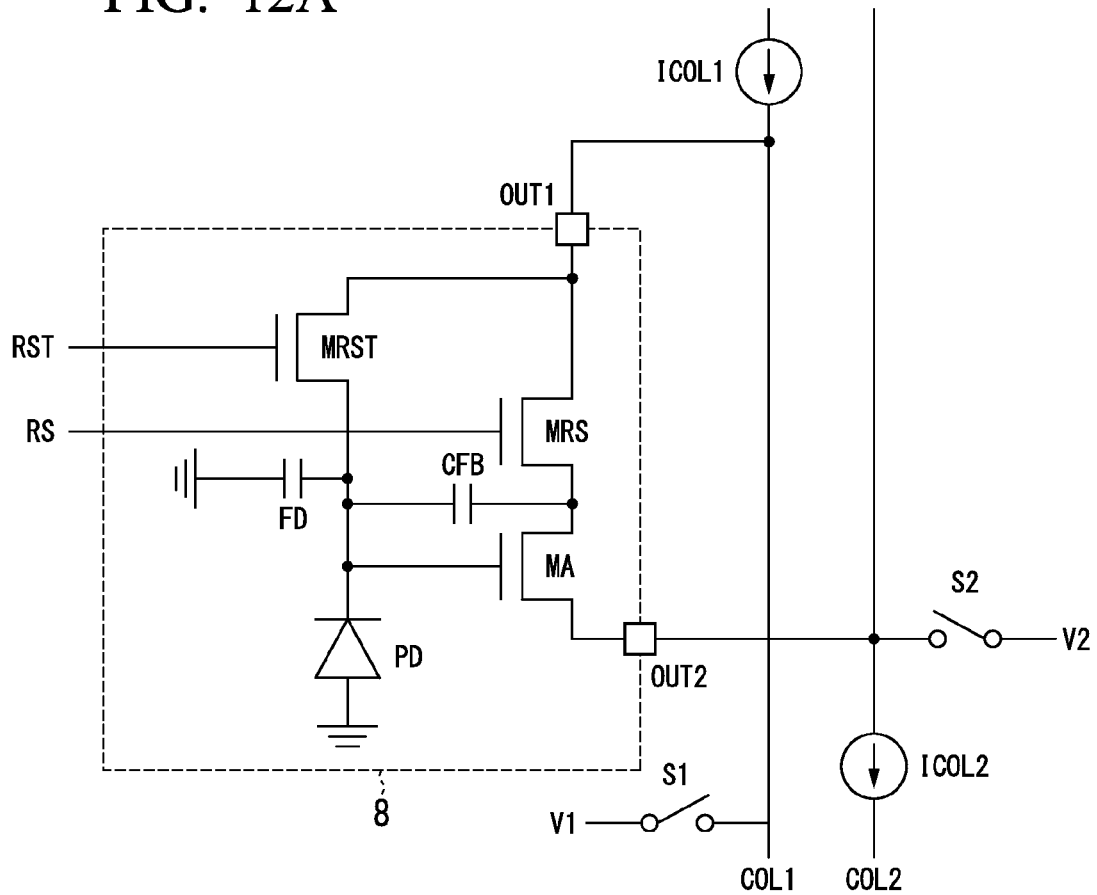
FIG. 12A is a diagram illustrating an example of a schematic configuration of a pixel included in a conventional CMOS image sensor.
Figure 12B:
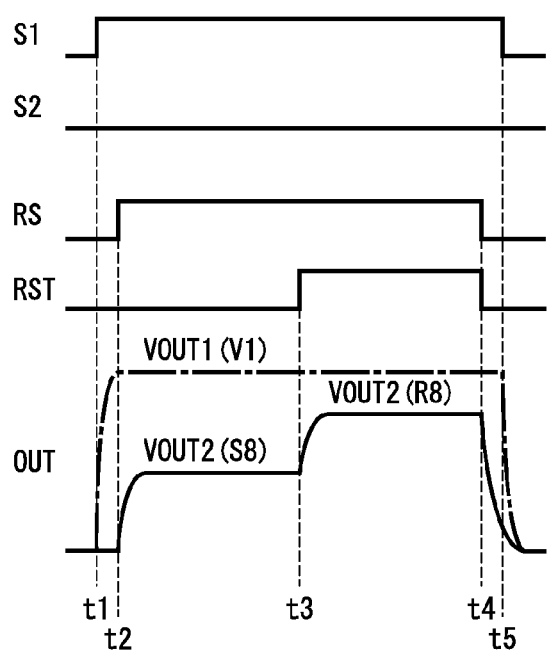
FIG. 12B is a diagram illustrating an example of driving timings of the pixel included in the conventional CMOS image sensor.
Figure 12C:
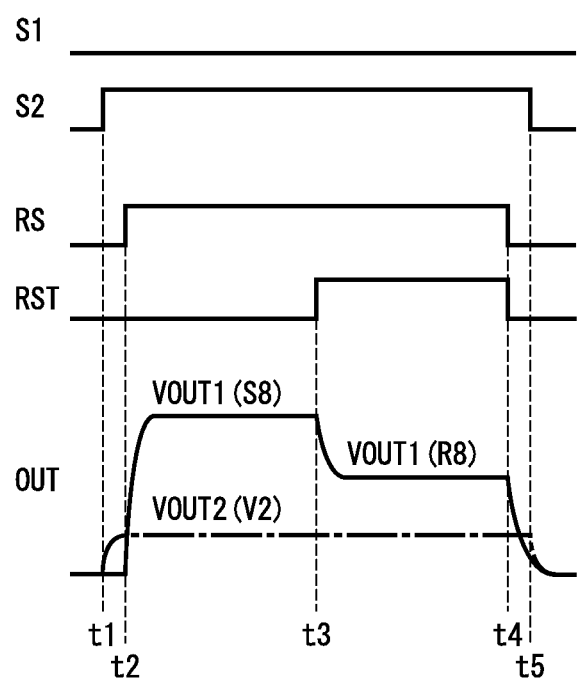
FIG. 12C is a diagram illustrating an example of driving timings of the pixel included in the conventional CMOS image sensor.
Figure 13:
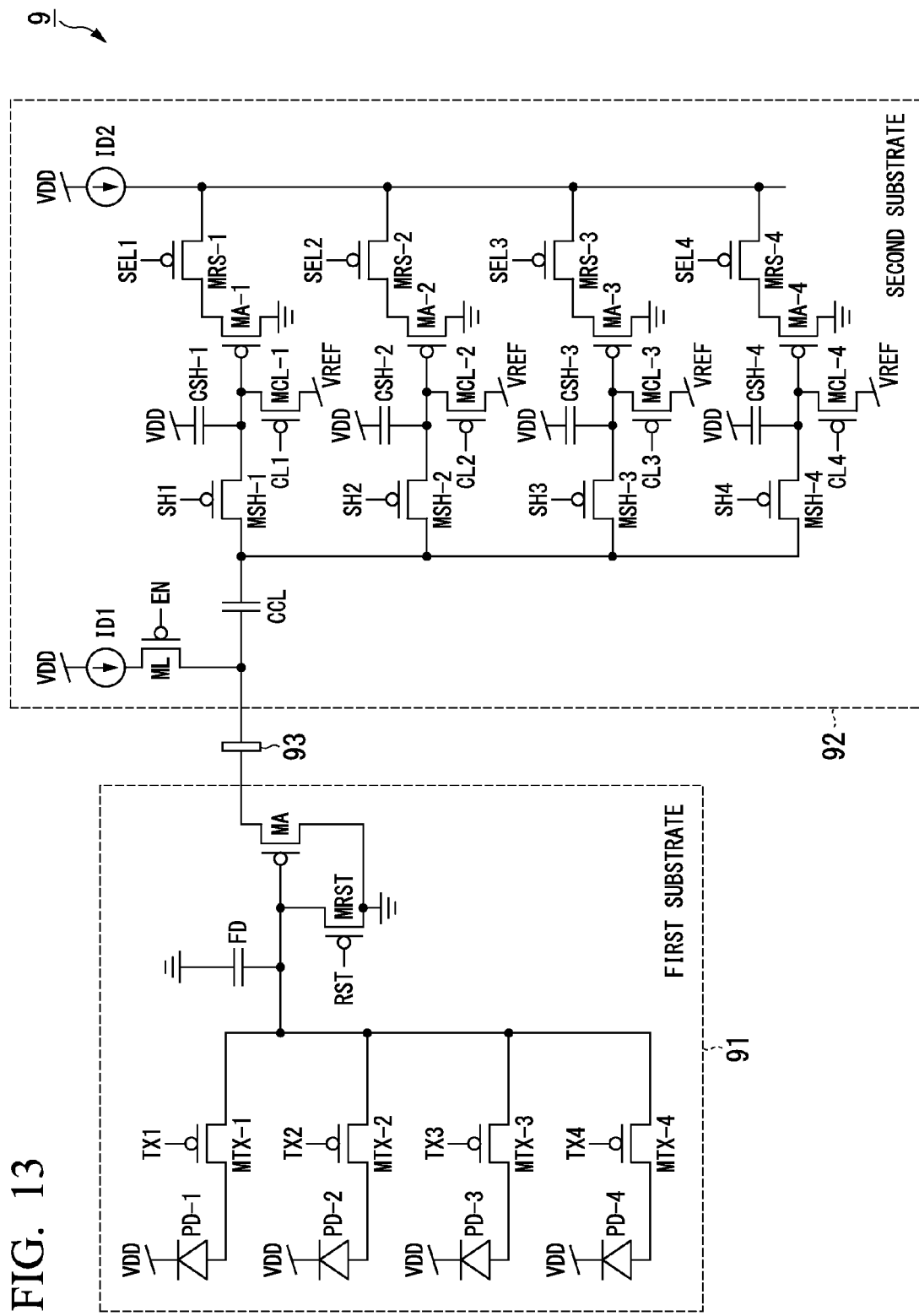
FIG. 13 is a diagram illustrating a schematic configuration of a pixel configured with divided substrates in the conventional CMOS image sensor.

In general, the second-mode feedback capacitor CFB requires a capacitance below 1[F]. Thus, the second-mode feedback capacitor CFB is realized using, for example, parasitic capacitance between metal wirings that form the unit pixel, or overlap capacitance of a transistor. Accordingly, a layout area in the first substrate in which the second-mode feedback capacitor CFB is formed does not affect an entire layout area of the pixel section 51, that is, a pixel size of the unit pixel 50. As a result, the pixel section 51 can realize both of the high S/N ratio and the wide dynamic range, similar to the conventional low-noise flexible pixel 8 as illustrated in FIG. 12A, with a layout area (pixel size) in which one transistor is only added to the conventional 4-transistor APS pixel 7 as illustrated in FIG. 11A.

The reading section 53 switches the constant current source for outputting the signal corresponding to the signal charge generated by the photodiode PD, which is input from the pixel section 51, as the pixel signal output by the unit pixel 50 in response to the control signal input front the vertical scanning circuit 20. The reading section 53 includes a first-mode constant current source transistor M10, a first-mode constant current source enable switch M9, a second-mode constant current source transistor M7, and a second-mode constant current source enable switch M8.

The first-mode constant current source transistor M10 is a constant current source that outputs a constant current corresponding to a constant voltage VNB in the first output mode.

The first-mode constant current source enable switch M9 controls the output of the constant current corresponding to the constant voltage VNB output by the first-mode constant current source transistor M10 in response to a first-mode enable signal EN-SF input from the vertical scanning circuit 20 in the first output mode.

The second-mode constant current source transistor M7 is a constant current source that outputs a constant current corresponding to a constant voltage VPB in the second output mode.

The second-mode constant current source enable switch MS controls the output of the constant current corresponding to the constant voltage VPB output by the second-mode constant current source transistor M7 in response to a second-mode enable inversion signal EN-CS-B that is an inversion signal of the second-mode enable signal EN-CS input front the vertical scanning circuit 20 in the second output mode.

The ground potential controller 52 switches a ground potential of a terminal to which a virtual ground node VVDD is connected among terminals of the amplification transistor M3 included in the pixel section 51 in response to the control signal input from the vertical scanning circuit 20.

The ground potential controller 52 includes a first power supply VDD, a second power supply VDC, a first-mode ground potential supply transistor M11, and a second-mode ground potential supply transistor M12.

The first-mode ground potential supply transistor M11 sets the potential of the virtual ground node VVDD to the potential of the first power supply VDD in response to a first-mode enable inversion signal EN-SF-B that is an inversion signal of the first-mode enable signal EN-SF input from the vertical scanning circuit 20 in the first output mode.

The second-mode ground potential supply transistor M12 sets the potential of the virtual ground node VVDD to a potential of the second power supply VDC in response to the second-mode enable signal EN-CS input from the vertical scanning circuit 20 in the second output mode.

The inter-substrate connection portion 54 is a connection portion for electrically connecting the first substrate to the second substrate. For example, a bump or the like fabricated using a vapor deposition method or a plating method is used as the inter-substrate connection portion 54. A space between the first substrate and the second substrate may be filled with an insulating member, such as an adhesive. The first substrate and the second substrate transmit and receive signals via the inter-substrate connection portion 54.

In the unit pixel 50 illustrated in FIG. 2, a node to which the second-mode cascode transistor M4, the second-mode feedback capacitor CFB, and the second-mode reset transistor M5 in the pixel section 51 of the first substrate are connected, and a node to which the first-mode constant current source enable switch M9 and the second-mode constant current source enable switch M8 in the reading section 53 of the second substrate are connected are connected via the inter-substrate connection portion 54.

A plurality of unit pixels 50 each having such a configuration are arranged is a two-dimensional matrix form in the pixel array unit 40 included in the solid-state image pickup device 1. In the unit pixel 50, the ground, potential controller 52 is not a component included in each unit pixel 50, but included for each row of the pixel array unit 40. That is, the ground potential controller 52 is shared by a plurality of unit pixels 50 arranged in the same row in the pixel array unit 40.

Figure 3:
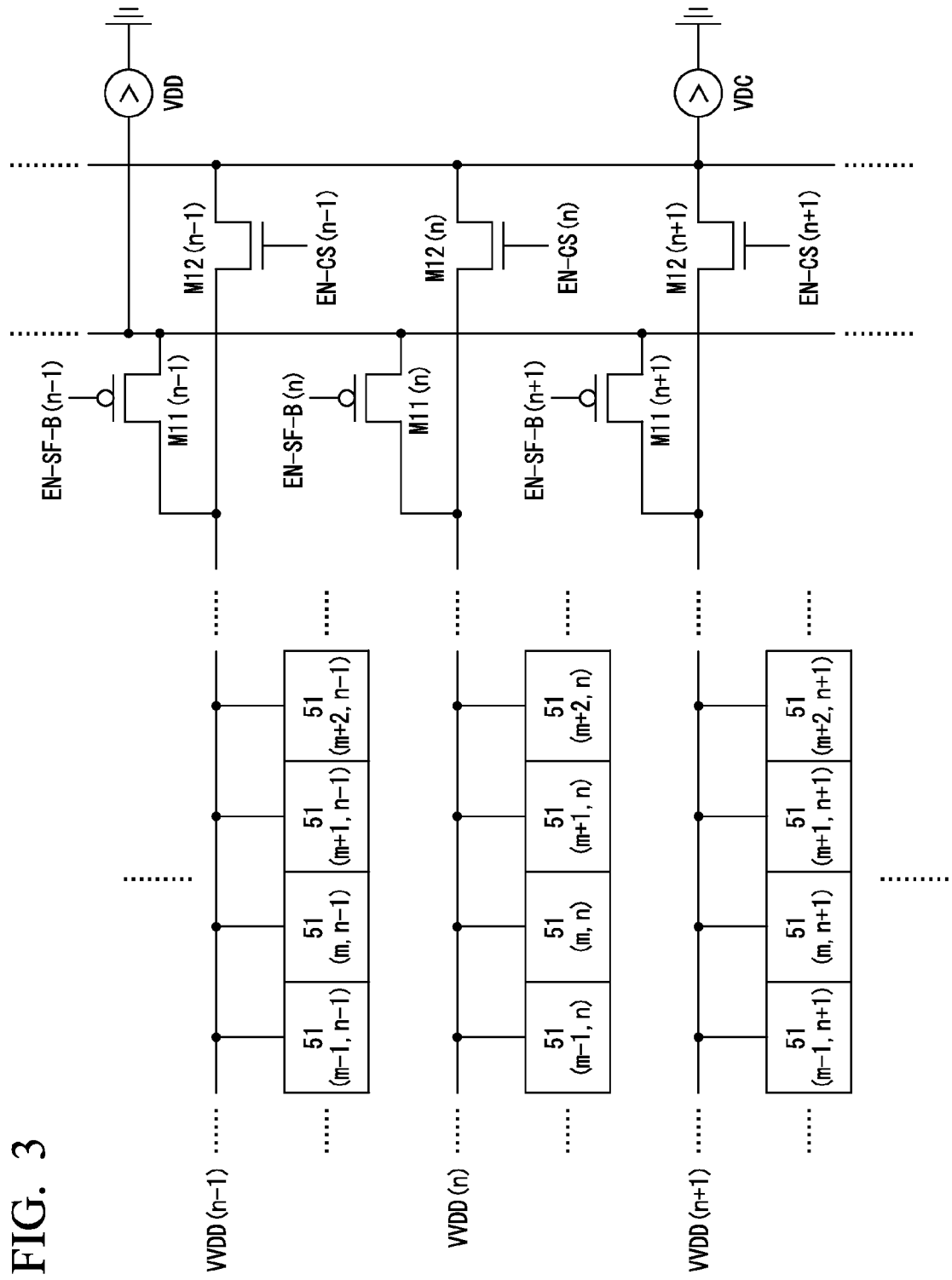
FIG. 3 is a circuit diagram illustrating a connection of components of the unit pixel arranged in a first substrate in the solid-state image pickup device of this embodiment.

FIG. 3 is a circuit diagram illustrating a connection of components of the unit pixel 50 arranged in the first substrate in the solid-state image pickup device 1 of this embodiment. In FIG. 3, the pixel sections 51 arranged in a certain row and preceding and subsequent rows, and the ground potential controllers 52 corresponding to the respective pixel sections 51 in the pixel array unit 40 of the solid-state image pickup device 1 are illustrated. In FIG. 3, a row number n and a column number m corresponding to each of the unit pixels 50 arranged in the pixel array unit 40 is represented within "( ): parentheses" after each reference sign. For example, the unit pixel 50 in an m-th column and an n-th row is represented as the unit pixel 50 (m, n). Further, the unit pixel 50 in the next column and the same row n of the unit pixel 50 (m, n) is represented as the unit pixel 50 (m+1, n), and the unit pixel 50 in the same column m and a previous row of the unit pixel 50 (m, n) is represented as the unit: pixel 50 (m, n−1).

As described above, the ground potential controller 52 is shared by the plurality of unit pixels 50 arranged in the same row in the pixel array unit 40. Further, the first power supply VDD and the second power supply VDC are shared by all the ground potential controllers 52. Accordingly, the first-mode ground potential supply transistor M11 corresponding to each row of the pixel array unit 40 sets the potential of the virtual ground node VVDD of the pixel sections 51 arranged in the same row in the pixel array unit 40 to a potential of the first power supply VDD when the unit pixel 50 is in the first output mode. Further, the second-mode ground potential supply transistor M12 corresponding to each row of the pixel array unit 40 sets the potential of the virtual ground node VVDD of the pixel sections 51 arranged in the same row in the pixel array unit 40 to a potential of the second power supply VDC when the unit pixel 50 is in the second output mode.

More specifically, when the unit pixel 50 is in the first output mode, the first-mode ground potential supply transistor M11 (n−1) to the first-mode ground potential supply transistor M11 (n+1) are set to an ON state, and the second-mode ground potential supply transistors M12 (n−1) to the second-mode ground potential supply transistor M12 (n+1) are set to an OFF state. Accordingly, a current and a voltage of the first power supply VDD are supplied to the virtual ground node VVDD (n−1) to the virtual ground node VVDD (n+1) via the first-mode ground potential supply transistor M11 (n−1) to the first-mode ground potential supply transistor M11 (n+1) corresponding thereto, and a potential of a terminal of an amplification transistors M3 included in each of the pixel sections 51 to which the virtual ground node VVDD is connected becomes the potential of the first power supply VDD.

Further, when the unit pixel 50 is in the second output mode, the second-mode ground potential supply transistor M12 (n−1) to the second-mode ground potential supply transistor M12 (n+1) are set to an ON state, and the first-mode ground potential supply transistors M11 (n−1) to the first-mode ground potential supply transistor M11 (n+1) are set to an OFF state. Accordingly, a current and a voltage of the second power supply VDC are supplied to the virtual ground node VVDD (n−1) to the virtual ground node VVDD(n+1) via the second-mode ground potential supply transistor M12 (n−1) to the second-mode ground potential supply transistor M12 (n+1) corresponding thereto, and the potential of the terminal of the amplification transistors M3 included in each of the pixel sections 51 to which the virtual ground node VVDD is connected becomes the potential of the second power supply VDC.

With such a configuration, the first-mode ground potential supply transistor M11 and the second-mode ground potential supply transistor M12 in each row deal with only a current flowing through the virtual ground node VVDD of the pixel section 51 in the same row. Accordingly, in the first output mode or the second output mode of the unit pixel 50, even when all the pixel sections 51 arranged in the pixel array unit 40 or the pixel sections 51 of a plurality of rows are simultaneously read, density of the current flowing through the virtual ground node VVDD can be dispersed in a row direction. As a result, if is possible to suppress voltage drop in the first-mode ground potential supply transistor M11 and the second-mode ground potential supply transistor M12, and widen a range of the power supply voltage when each pixel section 51 outputs the signal corresponding to the signal charge generated by the photodiode PD to the corresponding reading section 53 via the inter-substrate connection portion 54. Since the first-mode ground potential supply transistor M11 and the second-mode ground potential supply transistor M12 drive only the amplification transistor M3 included in the pixel section 51 connected to the corresponding virtual ground node VVDD, it is also possible to reduce a size of the transistor.

A case in which the first-mode ground potential supply transistor M11 and the second-mode ground potential supply transistor M12 are shared by all the pixel sections 51 arranged in the pixel array unit 40, that is, one ground potential controller 52 is included in the pixel array unit 40 is considered. In this case, in the first output mode or the second output mode of the unit pixel 50, when all the pixel sections 51 or the pixel sections 51 of a plurality of rows arranged in the pixel array unit 40 are simultaneously read, density of the current flowing through the virtual ground node VVDD, that is, the density of the current flowing through the first-mode ground potential supply transistor M11 or the second-mode ground potential supply transistor M12 becomes very high. Therefore, a voltage drop occurring between a source terminal and a drain terminal of the first-mode ground potential supply transistor M11 or the second-mode ground potential supply transistor M12 increases. As a result, a range of the actual power supply voltage that can be used by each pixel section 51 is narrowed, and a range of the pixel signal output by the unit pixel 50 is also narrowed. This causes degradation of the quality of a finally acquired image.

When the first-mode ground potential supply transistor M11 or the second-mode ground potential supply transistor M12 becomes in an ON state, it is preferable that the first-mode enable inversion signal EN-SF-B or the second-mode enable signal EN-CS input to a gate terminal of the transistor that is in an ON state is a voltage higher than the power supply voltage of the transistor that is in an ON state. That is, it is preferable to boost the voltage at the gate terminal of the transistor that is in an ON state. This is because the first-mode ground potential supply transistor M11 and the second-mode ground potential supply transistor M12 serve as a wiring that supplies a current and a voltage of the first power supply VDD or a current and a voltage of the second power supply VDC to the virtual ground node VVDD. By setting the voltage of the signal input to the gate terminal of the transistor in an ON state to the voltage higher than the power supply voltage of the transistor, it is possible to reduce ON resistance of the transistor in an ON state and cause the transistor in an ON state to be close to a more ideal wiring state. Accordingly, it is possible to reduce a loss of the current and the voltage of the first power supply VDD or the second power supply VDC supplied to the virtual ground node VVDD, and further widen a range of the supply voltage when the signal corresponding to the signal charge generated by the photodiode PD in each pixel section 51 is output.

Next, driving timings of the unit pixel 50 in the solid-state image pickup device 1 of this embodiment will be described. As described above, in the unit pixel 50, the pixel signal corresponding to the signal charge generated by the photodiode PD can be output (read) in the two types of output modes including the first output mode (source follower reading: drain-grounded reading) and the second output mode (common source reading: source-grounded reading).

The output mode of the unit pixel 50 is switched to any one of the first output mode and the second output mode by switching the current and the voltage supplied to the virtual ground node VVDD, that is, the ground potential of the terminal of the amplification transistor M3 included in the pixel section 51 to which the virtual ground node VVDD is connected using the ground potential controller 52, and switching the constant current source when the pixel signal is output, that is, a direction of the current flow through the amplification transistor M3 included in the pixel section 51 using the reading section 53.

Figure 4A:
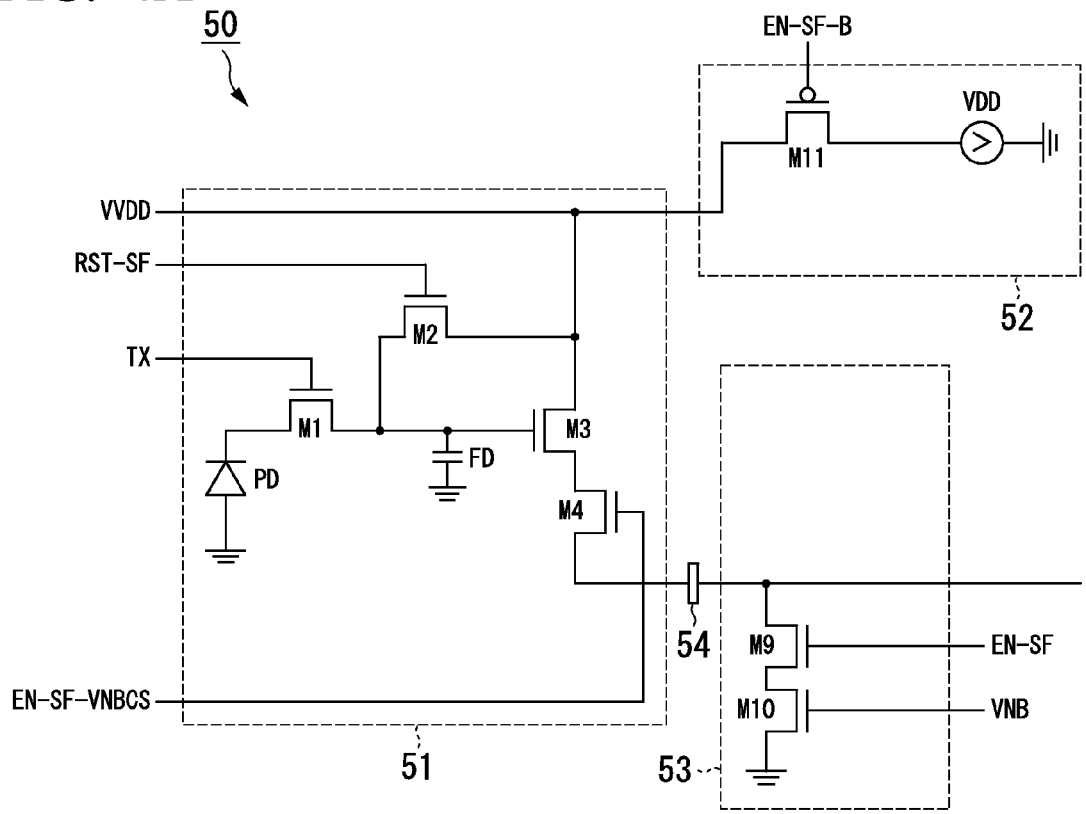
FIG. 4A is a circuit diagram illustrating components that operate when the unit pixel is driven in a first output mode in the solid-state image pickup device of this embodiment.
Figure 4B:
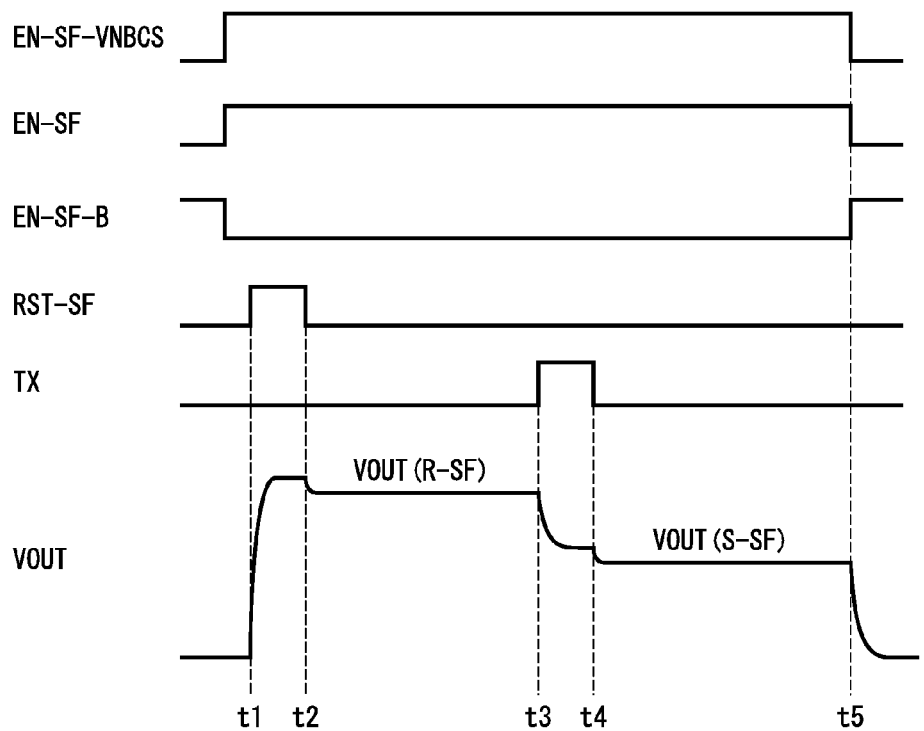
FIG. 4B is a timing chart illustrating driving timings, when the unit pixel is driven in the first output mode in the solid-state image pickup device of this embodiment.

First, a driving timing of the unit pixel 50 in the first output mode in which a pixel signal with a wide dynamic range is output will be described. FIGS. 4A and 4B illustrate components operating when the unit pixel 50 is driven in the first output mode and a timing chart illustrating a driving timing in the solid-state image pickup device 1 of this embodiment. FIG. 4A illustrates only components of the unit pixel 50 operating in outputting (reading) the pixel signal in the first output mode. Components of the unit pixel 50 not illustrated in FIG. 4A are components that do not operate in outputting (reading) the pixel signal in the first output mode, that is, the components are always in an OFF state.

In the first output mode, the transfer transistor M1, the first-mode reset transistor M2, and the second-mode cascode transistor M4 in the pixel section 51, the first-mode ground potential supply transistor M11 in the ground potential controller 52, and the first-mode constant current source transistor M10 and the first-mode constant current source enable switch M9 in the reading section 53 are controlled such that the pixel signal corresponding to the signal charge generated by the photodiode PD is output (read).

More specifically, the vertical scanning circuit 20 sets the switching signal EN-SF-VNBCS to a "High" level such that the second-mode cascode transistor M4 becomes in the ON state. Accordingly, a terminal of the amplification transistors M3 to which the second-mode cascode transistor M4 is connected is connected to the pixel output signal terminal OUT via the inter-substrate connection portion 54.

Further, the vertical scanning circuit 20 sets the first-mode enable signal EN-SF to a "High" level such that the first-mode constant current source enable switch M9 becomes in an ON state. Accordingly, the first-mode constant current source transistor M10 that is a constant current source that outputs a constant current corresponding to the constant voltage VNB is connected to a node to which the terminal of the amplification transistor M3, to which the second-mode cascode transistor M4 is connected, and the pixel output signal terminal OUT are connected. Since a voltage value of the constant voltage VNB supplied to a gate terminal of the first-mode constant current source transistor M10 is a voltage used for a constant current source that is supplied when source follower reading (drain-grounded reading) is performed in a general pixel, detailed description will be omitted.

Further, when the first-mode enable signal EN-SF is at a "High" level, the first-mode enable inversion signal EN-SF-B becomes at a "Low" level, and the first-mode ground potential supply transistor M11 becomes in an ON state. Accordingly, the potential of the virtual ground node VVDD becomes the potential of the first power supply VDD. The terminal of the amplification transistor M3 included in the pixel section 51 to which the virtual ground node VVDD is connected is a drain terminal. Further, the terminal of the amplification transistor M3 to which the second-mode cascode transistor M4 is connected is a source terminal.

In the first output mode, before the pixel signal corresponding to the signal charge generated by the photodiode PD is output (read), the vertical scanning circuit 20 controls the switching signal EN-SF-VNBCS and the first-mode enable signal EN-SF (including the first-mode enable inversion signal EN-SF-B) to be at respective levels, as described above. Accordingly a current can be extracted from the source terminal of the amplification transistor M3 by the first-mode constant current source transistor M10. The amplification transistor M3 operates in the first output mode, and the pixel signal corresponding to the signal charge generated by the photodiode PD is output from the pixel output signal terminal OUT.

A driving timing for the output (reading) of the pixel signal in the first output mode will be described with reference to FIG. 4B. First, the vertical scanning circuit 20 controls the pitching signal EN-SF-VNBCS and the first-mode enable signal EN-SP (including the first-mode enable inversion signal EN-SP-B) to be at respective levels to perform preparation in the first output mode.

Subsequently, at time t1, the vertical scanning circuit 20 sets the first-mode pixel reset signal RST-SF to a "High" level such that the first-mode reset transistor M2 becomes in an ON state. Accordingly, the floating diffusion layer FD is reset, and the potential of the floating diffusion layer FD becomes a potential reduced by the threshold voltage of the first-mode reset transistor M2 from the potential of the first power supply VDD (potential of the virtual ground node VVDD). Thus, the potential of the pixel output signal terminal OUT is reset to a potential close to the first power supply VDD corresponding to the potential of the floating diffusion layer FD.

Subsequently, at time t2, the vertical scanning circuit 20 sets the first-mode pixel reset signal RST-SF to a "Low" level such that the first-mode reset transistor M2 becomes in an OFF state and the operation of resetting the floating diffusion layer FD to the potential of the first power supply VDD ends. A period (period to time t3 in FIG. 4B) in which the potential of the pixel output signal terminal OUT is stabilized to the reset potential starts. During the period in which the potential of the pixel output signal terminal OUT is stabilized to the reset potential, the potential of the pixel output signal terminal OUT decreases by reset noise of the pixel section 51 and is stabilized to a potential of a reset potential VOUT(R-SF). The reset potential VOUT(R-SF) is a potential dropped by the amount of noise generated in the pixel section 51 in comparison with the potential of the first power supply VDD.

Subsequently, at time t3, the vertical scanning circuit 20 sets the pixel transfer signal TX to a "High" level such that the transfer transistor M1 becomes in an ON state and the signal charge generated by the photodiode PD is transferred to the floating diffusion layer FD. Accordingly, the potential of the floating diffusion layer FD becomes a potential corresponding to the signal charge generated by the photodiode PD due to exposure. In this case, the potential of the pixel output signal terminal OUT also decreases by the amount of charge corresponding to the signal charge transferred to the floating diffusion layer PD.

Subsequently, at time t4, the vertical scanning circuit 20 sets the pixel transfer signal TX to a "Low" level such that the transfer transistor M1 becomes in an OFF state and the operation of transferring the signal charge generated by the photodiode PD to the floating diffusion layer FD ends. Then, a period (period to time t5 in FIG. 4B) in which the potential of the pixel output signal terminal OUT is stabilized to the signal potential starts. During the period in which the potential of the pixel output signal terminal OUT is stabilized to the signal potential, the potential of the pixel output signal terminal OUT decreases under an influence when the transfer transistor M1 becomes in an OFF state and is stabilized to a potential of a signal potential VOUT(S-SF). The signal potential VOUT(S-SF) is a potential that depends on parasitic capacitance or the like due to a transfer path for each signal.

Subsequently, at time t5, the vertical scanning circuit 20 sets the switching signal EN-SF-VNBCS and the first-mode enable signal EN-SF to a "Low" level such that the second-mode cascode transistor M4 and the first-mode constant current source enable switch M9 becomes in an OFF state. Further, since the first-mode enable signal EN-SF is set to a "Low" level, the first-mode enable inversion signal EN-SF-B becomes at a "High" level, and the first-mode ground potential supply transistor M11 becomes in an OFF state. Accordingly, the source terminal of the amplification transistor M3 and the constant current source of the first-mode constant current source transistor M10 connected to the pixel output signal terminal OUT are disconnected from each other, and the potential of the pixel output signal terminal OUT becomes a potential that does not depend on the potential of the floating diffusion layer FD.

Thus, in the first output mode, the pixel section 51 outputs (reads) the reset signal at the reset potential VOUT(R-SF) when reset, and the pixel signal at the signal potential VOUT(S-SF) corresponding to the signal charge generated through photoelectric conversion of incident light by the photodiode PD to the pixel output signal terminal OUT.

Figure 5A:
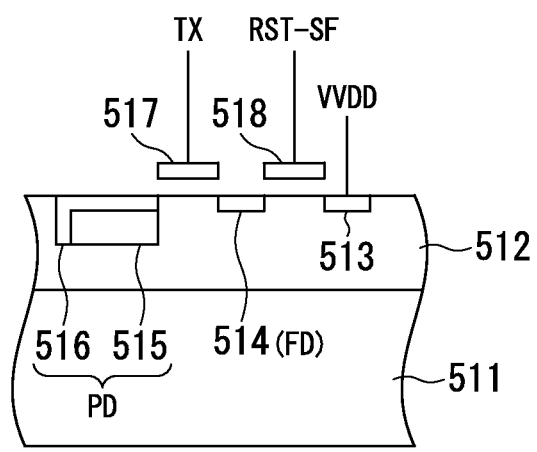
FIG. 5A is a view illustrating an operation when the unit pixel is driven in the first output mode in the solid-state image pickup device of this embodiment.
Figure 5B:
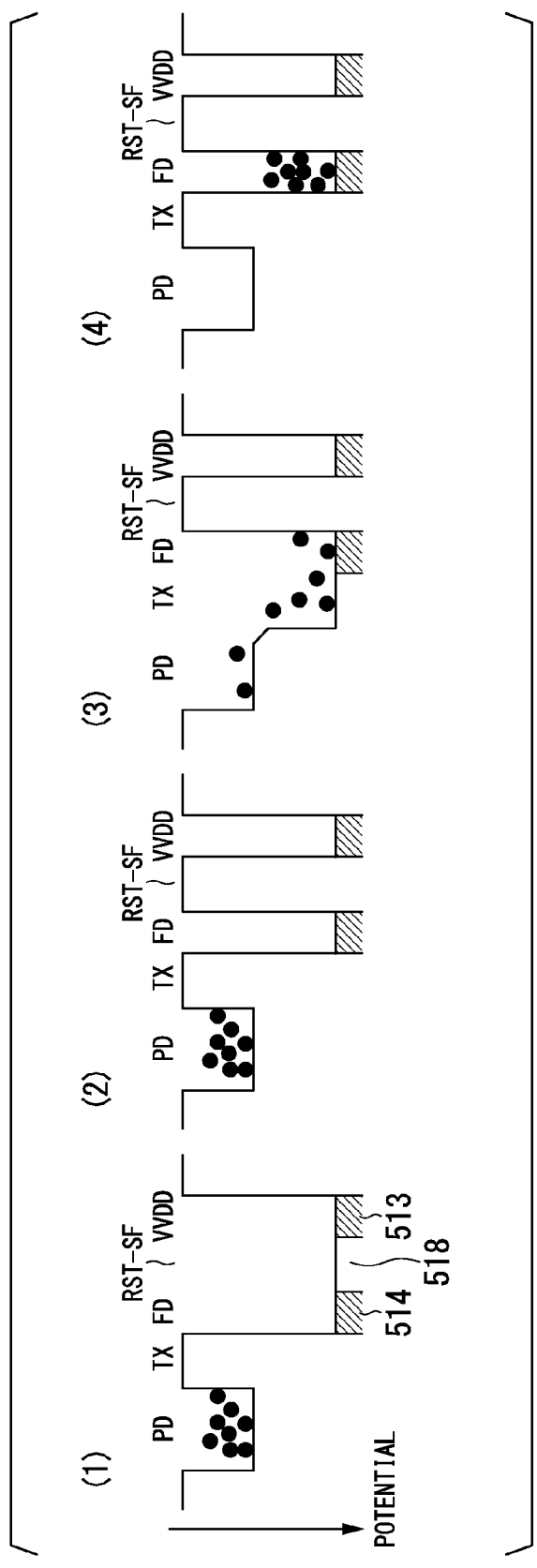
FIG. 5B is a diagram illustrating an operation when the unit pixel is driven in the first output mode in the solid-state image pickup device of this embodiment.

Here, an operation of the unit pixel 50 in the first output mode will be described. FIGS. 5A and 5B are diagrams illustrating an operation when the unit pixel 50 is driven in the first output mode in the solid-state image pickup device 1 of this embodiment. FIG. 5A is a cross-sectional view schematically illustrating a section of the pixel section 51 that operates in output (reading) of the pixel signal in the first output mode. Further, (1) to (4) of FIG. 5B are potential diagrams schematically illustrating the operation of the pixel section 51 at each time at the driving timing illustrated in FIG. 4B. Hereinafter, description will be given with reference to the driving timing illustrated in FIG. 4B.

In the cross-sectional view of the pixel section 51 in the first output mode illustrated in FIG. 5A, a silicon substrate 511 and an epitaxial layer 512 constituting the first substrate are illustrated. Further, FIG. 5A illustrates a diffusion layer 513 of a drain terminal of the first-mode reset transistor M2 to which the virtual ground node VVDD is connected, a wiring layer 514 serving as the floating diffusion layer FD, a diffusion layer 515 of the photodiode PD, and a diffusion layer 516 for a buried photodiode, which are formed in the epitaxial layer 512, and a wiring layer 517 of a gate terminal of the transfer transistor M1 to which the pixel transfer signal TX is input, and a wiring layer 518 of the gate terminal of the first-mode reset transistor M2 to which the first-mode pixel reset signal RST-SF is input, which are formed over the epitaxial layer 512.

Further, in the potential diagrams of the pixel section 51 in the first output mode illustrated in (1) to (4) of FIG. 5B, changes in potentials of the respective layers in the photodiode FD, the gate terminal of the transfer transistor M1, the floating diffusion layer FD, the gate terminal of the first-mode reset transistor M2, and the virtual ground node VVDD illustrated in FIG. 5A are illustrated.

In the potential diagrams illustrated in (1) to (4) of FIG. 5B, a "black circle" indicates the signal charge generated through photoelectric conversion of incident light by the photodiode PD. A larger number of signal charges indicate that the incident light is strong (bright). Further, the potential of the photodiode PD corresponds to the potential for depleting the photodiode PD.

In the potential diagrams illustrated in (1) to (4) of FIG. 5B, the position of the potential moves downwardly as the potential of each layer increases. Further, in the following description, a threshold value when each transistor becomes in an ON state or an OFF state is not considered for ease of description.

At time t1, the vertical scanning circuit 20 sets the first-mode pixel reset signal RST-SF to a "High" level such that the first-mode reset transistor M2 becomes in an ON state. Accordingly, the potential of the wiring layer 518 of the gate terminal of the first-mode reset transistor M2 increases (moves downwardly in (1) of FIG. 5B). Therefore, the potential of the diffusion layer 513 of the drain terminal of the first-mode cascode transistor M2 and the potential of the wiring layer 514 serving as the floating diffusion layer 103 become the same and are reset to the potential of the virtual ground node VVDD, that is, the potential of the first power supply VDD.

Further, at time t2, the vertical scanning circuit 20 sets the first-mode pixel reset signal RST-SF to a "Low" level such that the first-mode reset transistor M2 becomes in an OFF state. Accordingly, the potential of the wiring layer 518 of the gate terminal of the first-mode reset transistor M2 decreases (moves upwardly in (2) of FIG. 5B), and the operation of resetting the wiring layer 514 serving as the floating diffusion layer FD ends. In this state, reading of the reset signal of the reset potential VOUT(R-SF) is performed.

Further, at time t3, the vertical scanning circuit 20 sets the pixel transfer signal TX to a "High" level such that the transfer transistor M1 becomes in an ON state. Accordingly the potential of the wiring layer 517 of the gate terminal of the transfer transistor M1 increases (moves downwardly in (3) of FIG. 5B). Accordingly, the signal charge generated by the photodiode PD moves in a direction of the wiring layer 514 serving as the floating diffusion layer FD. Thus, transfer of the signal charge generated by the photodiode PD to the floating diffusion layer FD is performed.

Further, at time t4, the vertical scanning circuit 20 sets the pixel transfer signal TX to a "Low" level such that the transfer transistor M1 becomes in an OFF state. Accordingly, the potential of the wiring layer 517 of the gate terminal of the transfer transistor M1 decreases (moves upwardly in (4) of FIG. 5B), and the operation of transferring the signal charge generated by the photodiode PD to the floating diffusion layer FD ends. In this state, reading of the pixel signal of the signal potential VOUT(S-SF) is performed.

Thus, in the first output mode, reading of the reset signal at the reset potential VOUT(R-SF) when the pixel section 51 is reset, and the pixel signal at the signal potential VOUT (S-SF) corresponding to the signal charge generated through photoelectric conversion of incident light by the photodiode PD is performed.

Figure 6A:
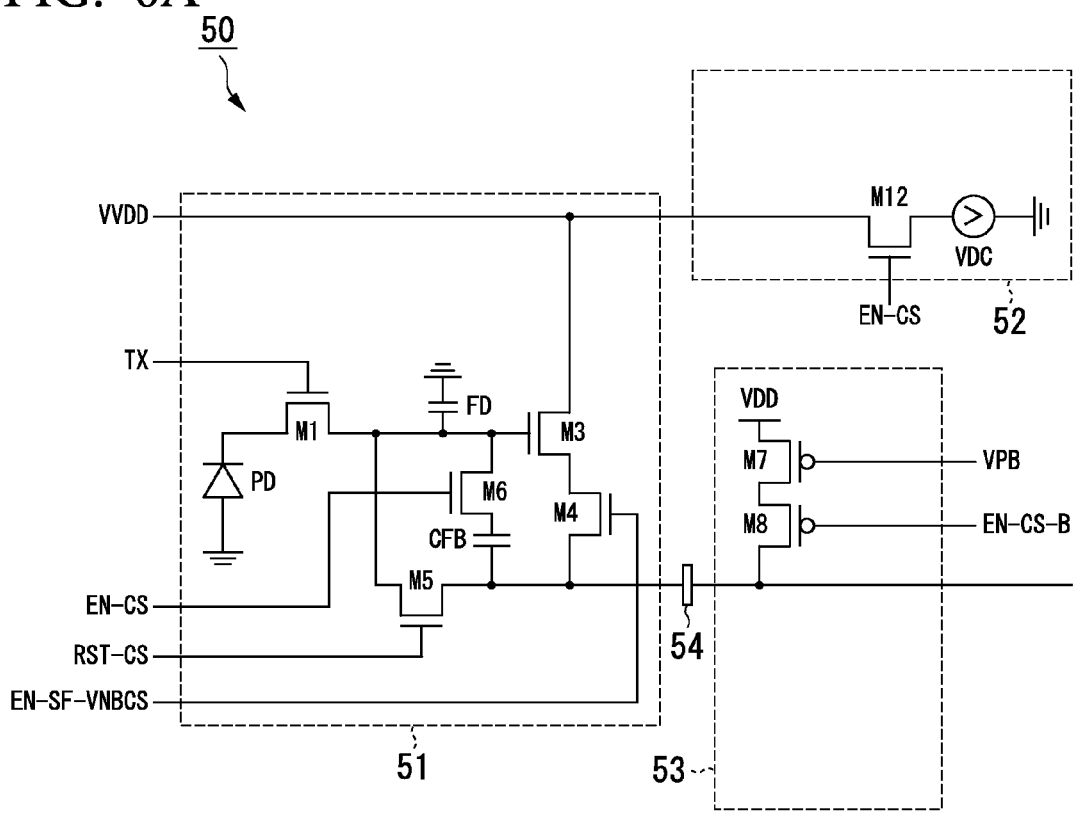
FIG. 6A is a circuit diagram illustrating components that operate when the unit pixel is driven in a second output mode in the solid-state image pickup device of this embodiment.
Figure 6B:
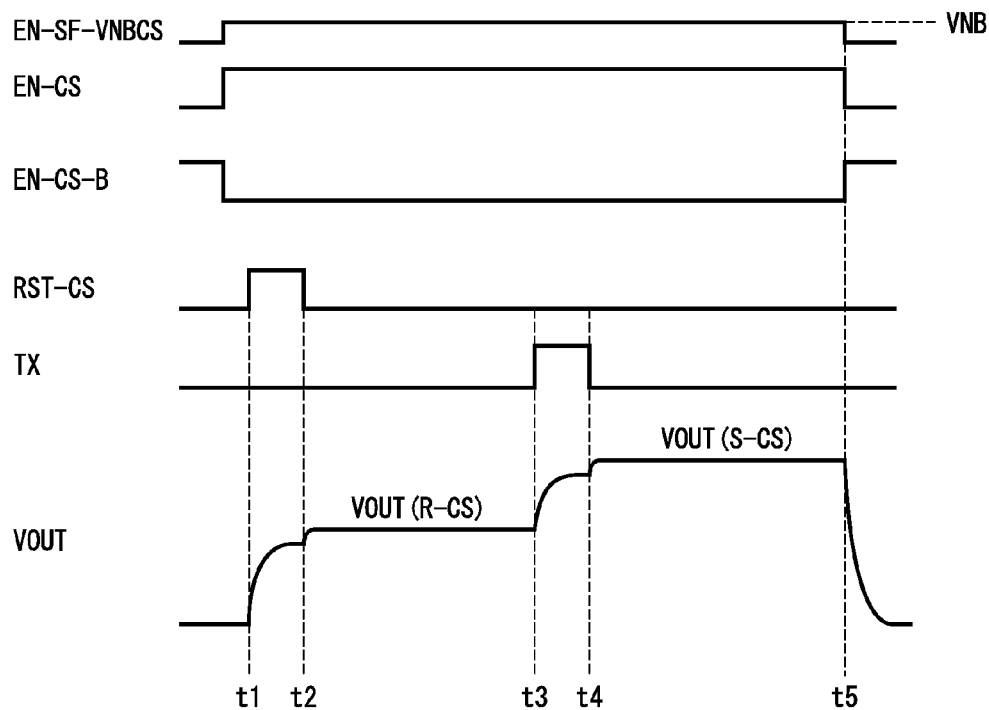
FIG. 6B is a timing chart illustrating driving timings when the unit pixel is driven in the second output mode in the solid-state image pickup device of this embodiment.

Next, a driving timing of the unit pixel 50 in the second output mode in which the pixel signal with a high S/N ratio is output will be described. FIGS. 6A and 6B illustrate components operating when the unit pixel 50 is driven in the second output mode and a timing chart illustrating driving timing in the solid-state image pickup device 1 of this embodiment. FIG. 6A illustrates only components of the unit pixels 50 operating in the output (reading) of the pixel signal in the second output mode. The components of the unit pixel 50 not illustrated in FIG. 6A are components that do not operate in output (reading) of the pixel signal in the second output mode, that is, always in an OFF state.

In the second output mode, the transfer transistor M1, the second-mode reset transistor M5, the second-mode feedback capacitor control transistor M6, and the second-mode cascode transistor M4 in the pixel section 51, the second-mode ground potential supply transistor M12 in the ground potential controller 52, and the second-mode constant current source transistor M7 and the second-mode constant current source enable switch M8 in the reading section 53 are controlled so that the pixel signal corresponding to the signal charge generated by the photodiode PD is output (read).

More specifically, the vertical scanning circuit 20 inputs a cascode voltage of a constant voltage (hereinafter referred to as a "cascode voltage VNB") to the switching signal EN-SF-VNBCS. Accordingly, the second-mode cascode transistor M4 and the second-mode feedback capacitor CFB constitute an amplification amplifier circuit (common gate-grounded, amplification circuit). An output of the amplification amplifier circuit is connected to the pixel output signal terminal OUT via the inter-substrate connection portion 54. Since a voltage value of the cascode voltage VNB supplied to the gate terminal of the second-mode cascode transistor M4 is a cascode voltage supplied when the (common source reading or source-grounded reading) is performed in a general pixel detailed description of a circuit or scheme of generating the cascode voltage will be omitted.

Further, the vertical scanning circuit 20 sets the second-mode enable signal EN-CS to a "High" level such that the second-mode enable inversion signal EN-CS-B becomes at a "Low" level and the second-mode constant current source enable switch M8 becomes in an ON state. Accordingly, the second-mode constant current source transistor M7 that is a constant current source that outputs a constant current corresponding to the constant voltage VFB is connected to a node to which the output of the amplification amplifier circuit and the pixel output signal terminal OUT are connected. Since a voltage value of the constant voltage VPB supplied to the gate terminal of the second-mode constant current source transistor M7 is a voltage used for a constant current source supplied when common source reading (source-grounded reading) is performed in a general pixel, a detailed description thereof will be omitted.

Further, since the second-mode enable signal EN-CS is at a "High" level the second-mode ground potential supply transistor M12 becomes in an ON state. Accordingly the potential of the virtual ground node VVDD becomes a potential of the second power supply VDC. A terminal of the amplification transistor M3 included in the pixel section 51 to which the virtual ground node VVDD is connected becomes a source terminal. Further, a terminal of the amplification transistor M3 to which the amplification amplifier circuit is connected becomes a drain terminal. The potential of the second power supply VDC is lower than the potential of the first power supply VDD, and is a potential for depleting the photodiode PD.

In the second output mode, before the pixel signal corresponding to the signal charge generated by the photodiode PD is output (read), the vertical scanning circuit 20 inputs the cascode voltage VNB to the switching signal EN-SF-VNBCS and controls its level to the second-mode enable signal EN-CS (including the second-mode enable inversion signal EN-CS-B), as described above. Accordingly, current is injected to the drain terminal of the amplification transistor M3 by the second-mode constant current source transistor M7, and the current can be extracted from the output of the amplification amplifier circuit. The amplification transistor M3 operates in the second output mode, and the pixel signal corresponding to the signal charge generated by the photodiode PD is output from the pixel output signal terminal OUT.

The driving timing for the output (reading) of the pixel signal in the second output mode will be described, here with reference to FIG. 6B. First, the vertical scanning circuit 20 inputs the cascode voltage VNB to the switching signal EN-SP-VNBCS and controls its level to the second-mode enable signal EN-CS (including the second-mode enable inversion signal EN-CS-B) and perform preparation in the second output mode.

Subsequently, at time t1, the vertical scanning circuit 20 sets the second-mode pixel reset signal RST-CS to a "High" level such that the second-mode reset transistor M5 becomes in the ON state. Accordingly, the floating diffusion layer FD is reset, and the potential of the floating diffusion layer FD becomes a potential (hereinafter referred to as a "summation potential") obtained by summing the potential of the second power supply VDC (the potential of the virtual ground node VVDD) and a potential of a threshold voltage of the amplification amplifier circuit. Accordingly, the potential of the pixel output signal terminal OUT is reset to the summation potential corresponding to the potential of the floating diffusion layer FD.

Subsequently, at time t2, the vertical scanning circuit 20 sets the second-mode pixel reset signal RST-CS to a "Low" level such that the second-mode reset transistor M5 becomes in an OFF state, and an operation of resetting the floating diffusion layer FD to the summation potential ends. A period (period to time t3 in FIG. 6B) in which the potential of the pixel output signal terminal OUT is stabilized to the reset potential starts. During the period in which the potential of the pixel output signal terminal OUT is stabilized to the reset potential, the potential of the pixel output signal terminal OUT increases by reset noise of the pixel section 51 and is stabilized to the potential of the reset potential VOUT(R-CS). The reset potential VOUT(R-CS) is a potential higher by the amount of noise generated in the pixel section 51 than the potential of the second power supply VDC.

Subsequently, at time t3, the vertical scanning circuit 20 sets the pixel transfer signal TX to a "High" level such that the transfer transistor M1 becomes in an ON state and the signal charge generated by the photodiode FD is transferred to the floating diffusion layer FD. Accordingly, the potential of the floating diffusion layer FD becomes a potential corresponding to the signal charge generated by the photodiode PD due to exposure. In this case, the potential of the pixel output signal terminal OUT also increases by the amount of charge corresponding to the signal charge transferred to the floating diffusion layer FD.

Subsequently, at time t4, the vertical scanning circuit 20 sets the pixel transfer signal TX to a "Low" level such that fee transfer transistor M1 becomes in an OFF state and the operation of transferring the signal charge generated by the photodiode PD to the floating diffusion layer PD ends. A period (period to time t5 in FIG. 6B) in which the potential of the pixel output signal terminal OUT is stabilized to the signal potential starts. During the period in which the potential of the pixel output signal terminal OUT is stabilized to the signal potential, the signal charge transferred to the floating diffusion layer FD is transferred to the second-mode feedback capacitor CFB, and the floating diffusion layer FD is kept at the potential when the second-mode reset transistor M5 becomes in an OFF state. Accordingly, the potential of the pixel output signal terminal OUT increases under an influence of the signal charge transferred to the second-mode feedback capacitor CFB, and is stabilized to the potential of the signal potential VOUT(S-CS). The signal potential VOUT(S-CS) is a potential that depends on parasitic capacitance or the like caused by a transfer path for each signal.

Subsequently, at time t5, the vertical scanning circuit 20 sets the second-mode enable signal EN-CS to a "Low" level such that the second-mode ground potential supply transistor M12 becomes in an OFF state. Further, since the second-mode enable signal EN-CS is at the "Low" level, the second-mode enable inversion signal EN-CS-B becomes at a "High" level, and the second-mode constant current source enable switch M8 becomes in an OFF state. Further, the input of the cascode voltage VNB to the switching signal EN-SF-VNBCS ends, and the supply of the cascode voltage VNB to the gate terminal of the second-mode cascode transistor M4 ends. Thereby, the output of the amplification amplifier circuit and the constant current source of the second-mode constant current source transistor M7, which has been connected to the pixel output signal terminal OUT, are disconnected from the pixel output signal terminal OUT. Thereby, the potential of the pixel output signal terminal OUT becomes a potential that does not depend on the potential of the floating diffusion layer FD.

Thus, in the second output mode, the reset signal at the reset potential VOUT(R-CS) when the pixel section 51 is reset, and the pixel signal at the signal potential VOUT(S-CS) corresponding to the signal charge generated through photoelectric conversion of incident light by the photodiode PD is output (read) to the pixel output signal terminal OUT.

Figure 7A:
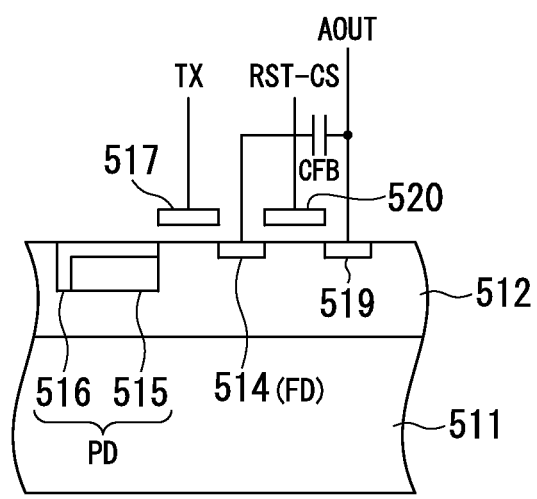
FIG. 7A is a view illustrating an operation when the unit pixel is driven in the second output mode in the solid-state image pickup device of this embodiment.
Figure 7B:
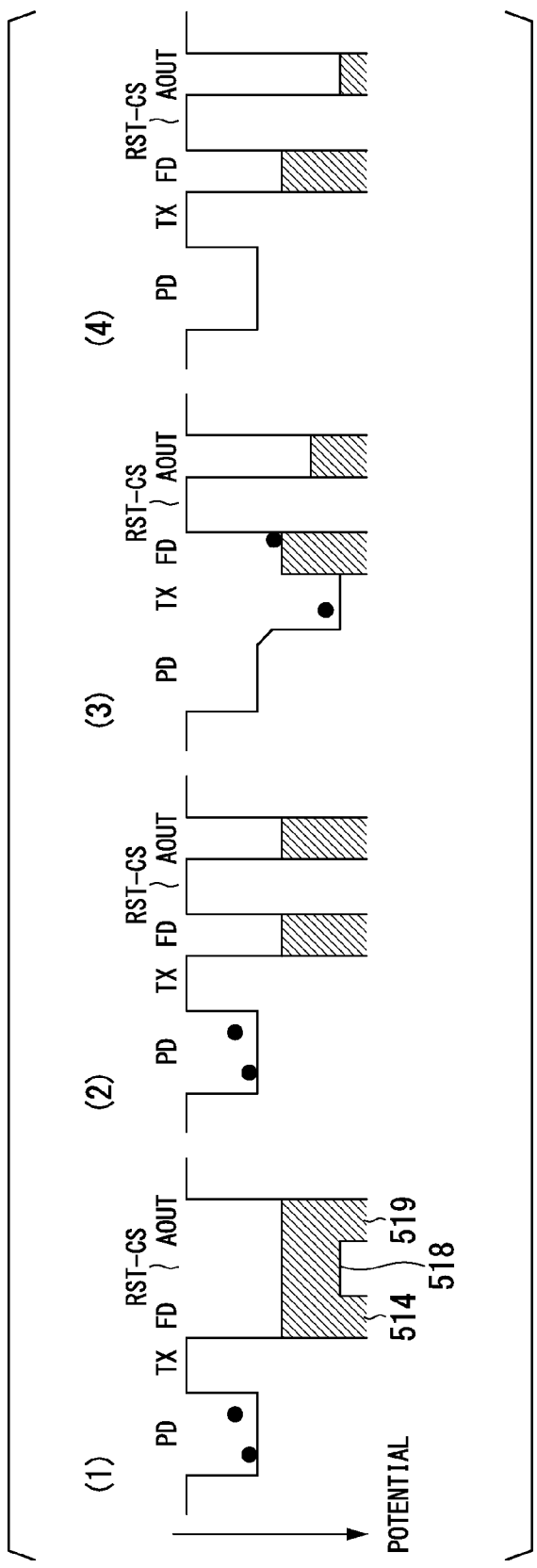
FIG. 7B is a diagram illustrating an operation when the unit pixel is driven in the second output mode in the solid-state image pickup device of this embodiment.

Here, the operation of the unit pixel 50 in the second output mode will be described. FIGS. 7A and 7B are diagrams illustrating an operation when the unit pixel 50 is driven in the second output mode in the solid-state image pickup device 1 of this embodiment. FIG. 7A is a cross-sectional view schematically illustrating the pixel section 51 operating when the pixel signal is output (read) in the second output mode. Further, (1) to (4) of FIG. 7B are potential diagrams schematically illustrating the operation of the pixel section SI at respective times at. me driving tinting illustrated in FIG. 6B. A description will be given with reference to the driving timings illustrated in FIG. 6B.

In the cross-sectional view of the pixel section 51 in the second output mode illustrated in FIG. 7A, a silicon substrate 511 and an epitaxial layer 512 constituting the first substrate are illustrated. Further, FIG. 7A illustrates a diffusion layer 510 of the drain terminal of the second-mode cascode transistor M4 that is the output terminal of the amplification amplifier circuit (hereinafter referred to as an "amplifier output terminal AOUT") to which the pixel output signal terminal OUT is connected, a wiring layer 514 serving as the floating diffusion layer FD, a diffusion layer 515 of the photodiode PD, and a diffusion layer 517 for a buried photodiode, which are formed in the epitaxial layer 512, and a wiring layer 517 of the gate terminal of the transfer transistor M1 to which the pixel transfer signal TX is input, and a wiring layer 520 of a gate terminal of the second-mode reset transistor M5 to which the second-mode pixel reset signal RST-CS is input, which are formed on the epitaxial layer 512.

Further, in the potential diagram of the pixel section 51 in the second output mode illustrated in (1) to (4) of FIG. 7B, changes in potentials of the respective layers in the photodiode PD, the gate terminal of the transfer transistor M1, the floating diffusion layer FD, the gate terminal of the second-mode reset transistor M5, and the drain terminal of the second-mode cascode transistor M4 which is the pixel output signal terminal OUT (amplifier output terminal AOUT) illustrated in FIG. 7A are illustrated.

In the potential diagrams illustrated in (1) to (4) of FIG. 7B, "black circles" indicate the signal charge generated through photoelectric conversion of incident light by the photodiode PD, similar to the potential diagrams illustrated in (1) to (4) of FIG. 5B. Since the second output mode is an output mode (reading mode) for outputting a pixel signal with a high S/N ratio in order to acquire a high-sensitivity image in photography at a place in which incident light is weak, that is, a dark place, the number of signal charges is assumed to be smaller than that in the potential diagrams illustrated in (1) to (4) of FIG. 5B. In this case, the potential of the photodiode PD (potential for depleting the photodiode PD) is the same as that in the potential diagrams illustrated in (1) to (4) of FIG. 5B.

In the potential diagrams illustrated in (1) to (4) of FIG. 7B, a position of the potential moves downwardly as the potential of each layer increases, similar to the potential diagrams illustrated in (1) to (4) of FIG. 5B. Further, in the following description, a threshold value when each transistor becomes in an ON state or an OFF state is not considered for ease of description.

At time t1, the vertical scanning circuit 20 sets the second-mode pixel reset signal RST-CS to a "High" level such that the second-mode reset transistor MS becomes in an ON state. Accordingly, the potential of the wiring layer 520 of the gate terminal of the second-mode reset transistor M5 increases (moves downwardly in (1) of FIG. 7B). Therefore, the potential of the diffusion layer 519 of the drain terminal of the second-mode cascode transistor M4 which is the pixel output signal terminal OUT and the potential of the wiring layer 514 serving as the floating diffusion layer FD become the same and are reset to a summation potential, that is, a potential obtained by summing the potential of the second power supply VDC (potential of the virtual ground node VVDD) and the potential of the threshold voltage of the amplification amplifier circuit.

Further, at time t2, the vertical scanning circuit 20 sets the second-mode pixel reset signal RST-CS to a "Low" level such that the second-mode reset transistor M5 becomes in an OFF state. Accordingly, the potential of the wiring layer 520 of the gate terminal of the second-mode reset transistor M5 decreases (moves upwardly in (2) of FIG. 7B), and the operation of resetting the wiring layer 514 serving as the floating diffusion layer FD ends. In this state, reading of the reset signal of the reset potential VOUT(R-CS) is performed.

Further, at time t3, the vertical scanning circuit 20 sets the pixel transfer signal TX to a "High" level such that the transfer transistor M1 becomes in an ON state. Accordingly, the potential of the wiring layer 517 of the gate terminal of the transfer transistor M1 increases (moves downwardly in (3) of FIG. 7B). Accordingly, the signal charge generated by the photodiode PD moves in a direction of the wiring layer 514 serving as the floating diffusion layer FD, and according to the movement of the signal charge, the potential of the diffusion layer 519 of the drain terminal of the second-mode cascode transistor M4 that is the pixel output signal terminal OUT increases (moves downwardly in (3) of FIG. 7B).

Further, at time t4, the vertical scanning circuit 20 sets the pixel transfer signal TX to a "Low" level such that the transfer transistor M1 becomes in an OFF state. Accordingly, the signal charge transferred to the floating diffusion layer FD is transferred to the second-mode feedback capacitor CFB, and the potential of the wiring layer 514 serving as the floating diffusion layer FD is kept as a potential when the second-mode reset transistor M5 becomes in an OFF state. Accordingly, the potential of the diffusion layer 519 of the drain terminal of the second-mode cascode transistor M4 which is the pixel output signal terminal OUT further increases (moves downwardly in (4) of FIG. 7B). In this state, reading of the pixel signal of the signal potential VOUT(S-CS) is performed.

Thus, in the second output mode, the pixel section 51 performs reading of the reset signal at the reset potential VOUT(R-CS) when reset, and the pixel signal at the signal potential VOUT(S-CS) corresponding to the signal charge generated through photoelectric conversion of incident light by the photodiode PD.

Thus, in the unit pixel 50 included in the pixel array unit 40 in the solid-state image pickup device 1, the ground potential of the terminal to which the virtual ground node VVDD is connected in the amplification transistor M3 included in the pixel section 51 is switched by the ground potential controller 52, and a direction of a current flowing through the amplification transistor M3 included in the pixel section 51 is switched by the reading section 53. Accordingly, in the unit pixels 50 included in the pixel array unit 40 in the solid-state image pickup device 1, it is possible to output the pixel signal in any one of the first output mode for realizing a wide dynamic range and the second output mode for realizing a high S/N ratio. Thus, in the unit pixel 50 included in the pixel array unit 40 in the solid-state image pickup device 1, it is possible to realize the solid-state image pickup device 1 in which both of a high S/N ratio and a wide dynamic range are achieved.

Further, in the unit pixels 50 included in the pixel array unit 40 in the solid-state image pickup device 1, the pixel signal with a wide dynamic range and the pixel signal with a high S/N ratio output in the respective output modes are output from one pixel output signal terminal. That is, in the unit pixel 50, the number of pixel output signal terminals OUT is reduced with the same function as that of the conventional low-noise flexible pixel 8 as illustrated in FIG. 12A. Therefore, in the unit pixel 50, it is possible to reduce the number of pixel output signal terminals OUT while having the same function as that of the conventional low-noise flexible pixel 8 as illustrated in FIG. 12A. Thus, in the unit pixel 50 included in the pixel array unit 40 in the solid-state image pickup device 1, even when the respective components in the unit pixel 50 are divided and arranged in the first substrate and the second substrate, and the first the substrate and the second substrate are bonded using a chip-stacking technology, the number of the inter-substrate connection portions 54 that connect the first substrate to the second substrate is reduced. Accordingly, it is possible to easily manufacture the solid-state image pickup device 1 in which both of a high S/N ratio and a wide dynamic range are achieved.

Further, the driving of the unit pixel 50 in each of the first output mode (source follower reading: drain-grounded reading) and the second output mode (common source reading: source-grounded reading) has been described at the driving timings of the unit pixel 50 described above. That is, the case in which the pixel signal corresponding to the signal charge generated by the photodiode PD is output (read) in any one of the first output mode in which an image with a wide dynamic range in which saturation of pixels is suppressed is acquired when a bright place or subject is photographed, and the second output mode in which an image with a high S/N ratio is acquired when a dark place or subject is photographed has been described.

However, in an image captured by the image pickup device having the solid-state image pickup device 1 mounted thereon, a bright region and a dark region exist within one view angle, that is, a region in which output of the pixel signal with a wide dynamic range is desired and a region in which output of the pixel signal with a high S/N ratio is desired exist in one image. In the unit pixel 50, it is possible to output both of the pixel signal with a wide dynamic range and the pixel signal with a high S/N ratio corresponding to the signal charge that is generated by the photodiode PD through one exposure. In this case, driving in the first output mode and driving in the second output mode are performed in succession, and the pixel signal output in the first output mode and the pixel signal output in the second output mode are summed. Accordingly, in the image pickup device having the solid-state image pickup device 1 mounted thereon, it is possible to acquire a higher quality image even when there are the bright region and the dark region.

As a method of summing the pixel signal output in the first output mode and the pixel signal output in the second output mode, for example, a method in which a summing circuit is included in the reading section 53 or the column signal processing circuit 60, and the respective pixel signals are summed in the form of an analog signal by the summing circuit may be considered. For example, a method in which respective pixel signals are converted into digital signals outside the column signal processing circuit 60 or the solid-state image pickup device 1, and then are summed in the form of a digital signal by a summing circuit or an image processing circuit may also be considered. However, the method or the configuration for summing the pixel signal output in the first output mode and the pixel signal output in the second output mode is not particularly limited.

Figure 8A:
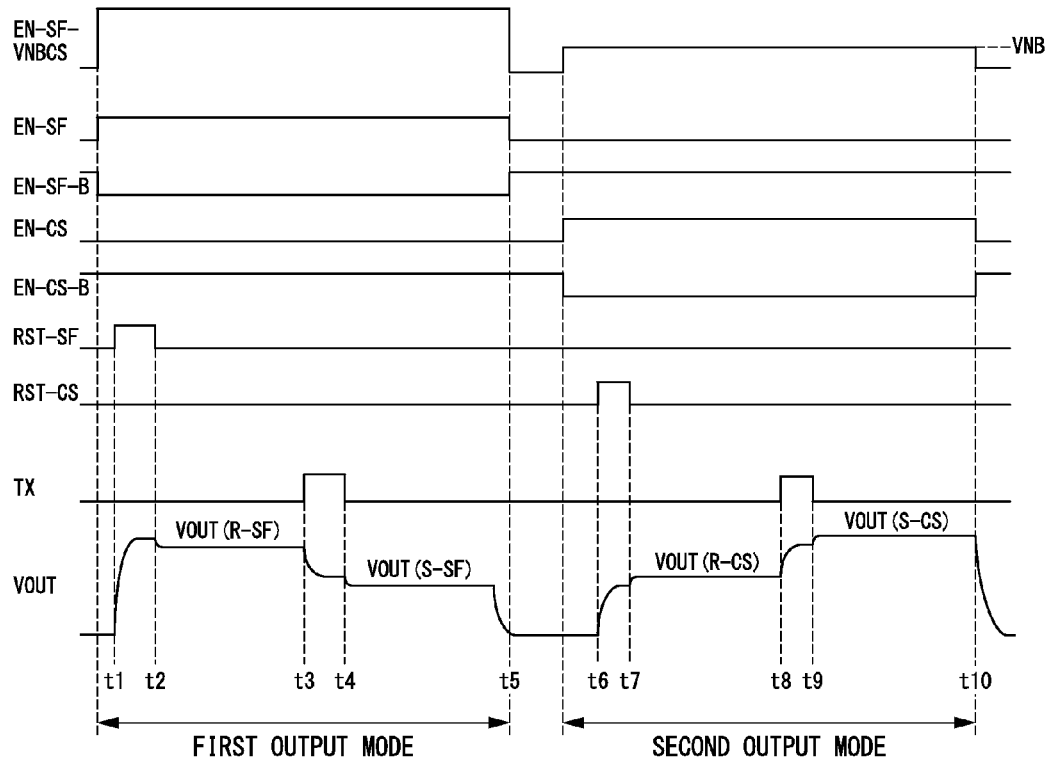
FIG. 8A is a timing chart illustrating driving timings when the unit pixel is driven in the first output mode and the second output mode in the solid-state image pickup device of this embodiment.
Figure 8B:
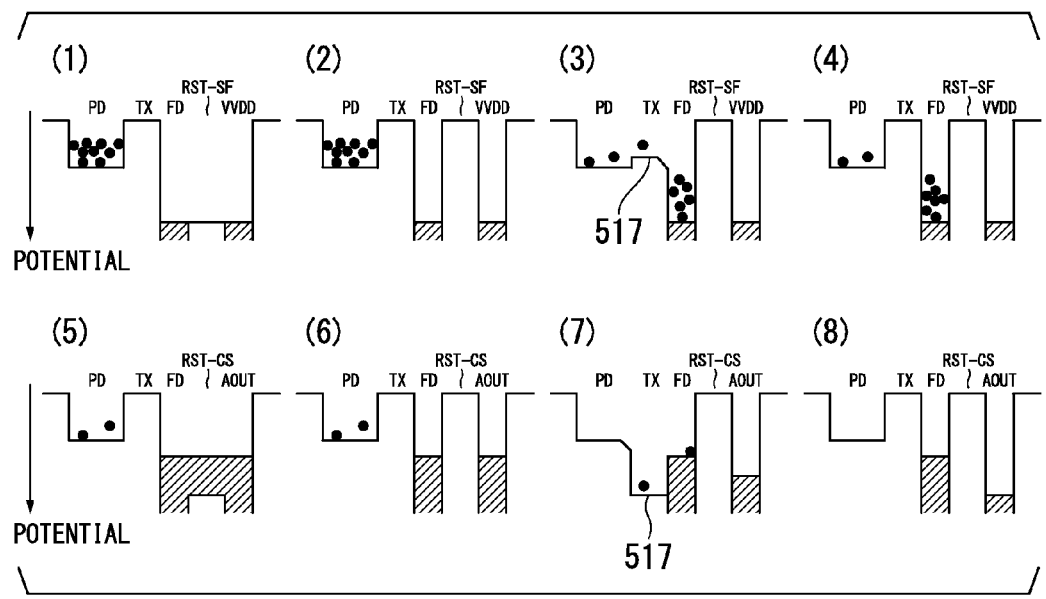
FIG. 8B is a diagram illustrating an operation of the unit pixel in the first output mode and the second output mode in the solid-state image pickup device of this embodiment.

Driving timings of the unit pixel 50 when both of a pixel signal with a wide dynamic range and a pixel signal with a high S/N ratio corresponding to the signal charge that is generated by the photodiode PD through one exposure are output will be described here. FIGS. 8A and 8B are diagrams illustrating driving timings at which the unit pixel 50 is driven in the first output mode and the second output mode, and an operation of the unit pixels 50 in the solid-state image pickup device 1 of this embodiment. FIG. 8A illustrates driving timings when both of a pixel signal with a wide dynamic range and a pixel signal with a high S/N ratio corresponding to the signal charge that is generated by the photodiode PD through one exposure, and (1) to (8) of FIG. 8B illustrate potential diagrams schematically illustrating the operation of the pixel section 51 at each time at the driving timing illustrated in FIG. 8A. The driving timings of the unit pixel 50 illustrated in FIG. 8A will be described with reference to the potential diagrams illustrated in (1) to (8) of FIG. 9B. The potential diagrams illustrated in (1) to (8) of FIG. 8B illustrate potentials of respective layers of a cross-sectional view of the pixel section 51 illustrated in FIG. 5A or 7A. Further, in the potential diagrams illustrated in (1) to (8) of FIG. 8B, the signal charge generated through photoelectric conversion of incident light by the photodiode PD is indicated by "black circle," and it is assumed that a position of the potential moves downwardly as the potential of each layer increases, similar to the potential diagrams illustrated in (1) to (4) of FIG. 8B and (1) to (4) of FIG. 7B.

When both of the pixel signal with a wide dynamic range and the pixel signal with a high S/N ratio corresponding to the signal charge that is generated by the photodiode PD through one exposure are output, the unit pixel 50 is first driven in the first output mode, and subsequently, the unit pixels 50 are driven in the second output mode. That is, the pixel signal with a wide dynamic range is first output, and subsequently, the pixel signal with a high S/N ratio is output.

First the vertical scanning circuit 20 controls the switching signal EN-SF-VNBCS and the first-mode enable signal EN-SF (including the first-mode enable inversion signal BM-SF-B) to be at respective levels to output (read) the pixel signal in the first output mode.

Subsequently, at time t1, the vertical scanning circuit 20 sets the first-mode pixel reset signal RST-SF to a "High" level such that the first-mode reset transistor M2 becomes in an ON state. Accordingly as illustrated in (1) of FIG. 8B, a potential of the wiring layer 518 of the gate terminal of the first-mode reset transistor M2 increases (moves downwardly in (1) of FIG. 8B), and the potential of the floating diffusion layer FD is reset to the potential of the virtual ground node VVDD, that is, a potential reduced by the threshold voltage of the first-mode reset transistor M2 from the potential of the first power supply VDD. Accordingly, the potential of the pixel output signal terminal OUT becomes a potential close to the first power supply VDD corresponding to the potential of the floating diffusion layer FD.

Subsequently, at time t2, the vertical scanning circuit 20 sets the first-mode pixel reset signal RST-SF to a "Low" level such that the first-mode reset transistor M2 becomes in an OFF state. Accordingly, as illustrated in (2) of FIG. 8B, the potential of the wiring layer 518 of the gate terminal of the first-mode reset transistor M2 decreases (moves upwardly in (2) of FIG. 8B), and an operation of resetting the floating diffusion layer FD to the potential of the first power supply VDD ends. A period (period to time t3 in FIG. 8A) in which the potential of the pixel output signal terminal OUT is stabilized to the reset potential starts. During the period in which the potential of the pixel output signal terminal OUT is stabilized to the reset potential, the potential of the pixel output signal terminal OUT decreases by reset noise of the pixel section 51 and is stabilized to the potential of the reset potential VOUT(R-SF). In this state, reading of the reset signal of the reset potential VOUT(R-SF) is performed.

Subsequently, at time t3, the vertical scanning circuit 20 sets the pixel transfer signal TX to a "High" level such that the transfer transistor M1 becomes in an ON state. In this case, the vertical scanning circuit 20 sets the "High" level of the pixel transfer signal TX to a predetermined fixed voltage (hereinafter referred to as a "first gate terminal voltage") that does not increase the potential of the wiring layer 517 of the gate terminal of the transfer transistor M1. Accordingly, as illustrated in (3) of FIG. 8B, the potential of the wiring layer 517 of the gate terminal of the transfer transistor M1 increases up to the potential corresponding to the first gate terminal voltage (moves downwardly in (3) of FIG. 8B), and the signal charge generated by the photodiode PD is moved (transferred) by a fixed rate according to the first gate terminal voltage in a direction of the wiring layer 514 serving as the floating diffusion layer FD. Accordingly, the potential of the floating diffusion layer FD becomes a potential corresponding to the moving signal charge, and the potential of the pixel output signal terminal OUT also decreases by the amount of charge corresponding to the signal charge transferred to the floating diffusion layer FD.

It is preferable that a fixed rate at which the signal charge generated by the photodiode PD is transferred to the floating diffusion layer FD is set to $1/A_{CL}$. $A_{CL}$ is an amplification factor of the signal charge in the second output mode shown in liquation (3) above. Accordingly, the first gate terminal voltage is a voltage for transferring the signal charge to the floating diffusion layer FD at a rate of $1/A_{CL}$.

At time t3, signal charge remaining instead of being transferred to the floating diffusion layer FD is still stored in the photodiode PD.

Subsequently at time t4, the vertical scanning circuit 20 sets the pixel transfer signal TX to a "Low" level such that the transfer transistor M1 becomes in an OFF state. Accordingly, as illustrated in (4) of FIG. 8B, the potential of the wiring layer 517 of the gate terminal of the transfer transistor M1 decreases (moves upwardly in (4) of FIG. 8B), and the operation of transferring the amount of signal charge corresponding to the first gate terminal voltage to the floating diffusion layer FD ends. A period (period to time t5 in FIG. 8A) in which the potential of the pixel output signal terminal OUT is stabilized to the signal potential starts. During the period in which the potential of the pixel output signal terminal OUT is stabilized to the signal potential, the potential of the pixel output signal terminal OUT decreases under an influence when the transfer transistor M1 is OFF and is stabilized to the potential of the signal potential VOUT(S-SF). In this state, reading of the pixel signal of the signal potential VOUT(S-SF) is performed.

Subsequently, at time t5, the vertical scanning circuit 20 controls the switching signal EN-SF-VNBCS and the first-mode enable signal EN-SF (including the first-mode enable inversion signal EN-SF-B) to be at respective levels so as to end the output (reading) of the pixel signal in the first output mode.

Subsequently the vertical scanning circuit 20 inputs the cascode voltage VNB to the switching signal EN-SF-VNBCS to control the level of the second-mode enable signal EN-CS (including the second-mode enable inversion signal EN-CS-B) such that the pixel signal in the second output mode is output (read).

Subsequently, at time t6, the vertical scanning circuit 20 sets the second-mode pixel reset signal RST-CS to a "High" level such that the second-mode reset transistor M5 becomes in an ON state. Accordingly, as illustrated in (5) of FIG. 8B, the potential of the wiring layer 520 of the gate terminal of the second-mode reset transistor M5 increases (moves downwardly in (5) of FIG. 8B), and the potential of the floating diffusion layer FD is reset to the summation potential, that is, to a potential obtained by summing the potential of the second power supply VDC and a potential of the threshold voltage of the amplification amplifier circuit. Accordingly, the potential of the pixel output signal terminal OUT becomes the summation potential corresponding to the potential of the floating diffusion layer FD.

Subsequently, at time t7, the vertical scanning circuit 20 sets the second-mode pixel reset signal RST-CS to a "Low" level such that the second-mode reset transistor M5 becomes in an OFF state. Accordingly, as illustrated in (6) of FIG. 8B, the potential of the wiring layer 518 of the gate terminal of the second-mode reset transistor M5 decreases (moves upwardly in (6) of FIG. 8B), and the operation of resetting the floating diffusion layer FD to the summation potential ends. A period (period to time t8 in FIG. 8A) in which the potential of the pixel output signal terminal OUT is stabilized to the reset potential starts. During the period in which the potential of the pixel output signal terminal OUT is stabilized to the reset potential, the potential of the pixel output signal terminal OUT increases by reset noise of the pixel section 51 and is stabilized to the potential of the reset potential VOUT(R-CS). In this state, reading of the reset signal of the reset potential VOUT(R-CS) is performed.

Subsequently, at time t8, the vertical scanning circuit 20 sets the pixel transfer signal TX to a "High" level such that the transfer transistor M1 becomes in an ON state. In this case, the vertical scanning circuit 20 sets the "High" level of the pixel transfer signal TX to a predetermined feed voltage (hereinafter, referred to as a "second gate terminal voltage") that enables the potential of the wiring layer 517 of the gate terminal of the transfer transistor M1 to completely rise, that is, enables all the signal charge generated by the photodiode PD to be transferred to the floating diffusion layer FD. Accordingly, as illustrated in (7) of FIG. 8B, the potential of the wiring layer 517 of the gate terminal of the transfer transistor M1 increases to the highest potential corresponding to the second gate terminal voltage (moves downwardly in (7) of FIG. 8B), and all the signal charge generated by the photodiode PD is move (transferred) in a direction of the wiring layer 514 serving as the floating diffusion layer FD. Accordingly, the potential of the floating diffusion layer FD becomes a potential increasing according to signal charge remaining in the photodiode PD instead of being transferred to the floating diffusion layer FD at time t3, and the potential of the pixel output signal terminal OUT also increases by the amount corresponding to the rising potential of the floating diffusion layer FD.

Subsequently, at time t9, the vertical scanning circuit 20 sets the pixel transfer signal TX to a "Low" level such that the transfer transistor M1 becomes in an OFF state, and the operation of transferring the signal charge generated by the photodiode PD to the floating diffusion layer FD ends. A period (to time 110 in FIG. 8A) in which the potential of the pixel output signal terminal OUT is stabilized to the signal potential starts. During the period in which the potential of the pixel output signal terminal OUT is stabilized to the signal potential, the signal charge transferred to the floating diffusion layer FD is transferred to the second-mode feedback capacitor CFB, and the potential of the wiring layer 514 serving as the floating diffusion layer FD remains at the potential when the second-mode reset transistor M5 becomes in an OFF state. Accordingly, the potential of the diffusion layer 519 of the drain terminal of the second-mode cascode transistor M4 that is the pixel output signal terminal OUT further increases (moves downwardly in (8) of FIG. 8B) and is stabilized to the potential of the signal potential VOUT(S-CS). In this state, reading of the pixel signal of the signal potential VOUT(S-CS) is performed.

Subsequently, at time t10, the vertical scanning circuit 20 ends the input of the cascode voltage VNB to the switching signal EN-SF-VNBCS, and controls the level of the second-mode enable signal EN-CS (including the second-mode enable inversion signal EN-CS-B) to end the output (reading) of the pixel signal in the second output mode.

Thus, both of the pixel signal with a wide dynamic range and the pixel signal with a high S/N ratio corresponding to the signal charge that is generated by the photodiode PD through one exposure are output (read). More specifically, the reset signal of the reset potential VOUT(R-SF) and the pixel signal of the signal potential VOUT(S-SF) in the first output mode, and the reset signal of the reset potential VOUT(R-CS) and the pixel signal of the signal potential VOUT(S-CS) in the second output mode are output to the pixel output signal terminal OUT.

Thus, in the unit pixel 50, the output (reading) of the pixel signal in the second output mode for realizing a high S/N ratio, subsequent to the output (reading) of the pixel signal in the first output mode for realizing the wide dynamic range, is performed such that the pixel signal with a wide dynamic range and the pixel signal with a high S/N ratio is output from one pixel output signal terminal OUT. Accordingly, it is possible to sum the pixel signal with a wide dynamic range and the pixel signal with a high S/N ratio, and even when a bright region and a dark region exists within one view angle, it is possible to output the pixel signal with a high S/N ratio with high sensitivity in the dark region, and the pixel signal with a wide dynamic range in which saturation of the pixel is suppressed in the bright region, and, to acquire a higher quality image in which both of a wide dynamic range and a high S/N ratio are achieved in one image.

As described above, according to a mode for carrying out the present invention, the ground potential of the terminal of the amplification transistor to which the virtual ground node is connected is switched, and the direction of the current flow through the amplification transistor is switched. Accordingly, in each unit pixel of the solid-state image pickup device according to the mode tor carrying out the present invention, it is possible to output the pixel signal in any one of the first output mode for realizing a wide dynamic range and the second output mode for realizing a high S/N ratio. Thus, in the mode for carrying out the present invention, it is possible to realize the solid-state image pickup device in which both of a high S/N ratio and a wide dynamic range are achieved.

Further, in each unit pixel of the solid-state image pickup device according to the mode for carrying out the present invention, the pixel signal with a wide dynamic range and the pixel signal with a high S/N ratio output in the respective output modes are output from one pixel output signal terminal. Accordingly, in the mode for carrying out the present invention, even when the solid-state image pickup device in which the respective components of the unit pixel are divided and arranged in the first substrate and the second substrate, and the first substrate and the second substrate are bonded using a chip-stacking technology are fabricated, it is possible to reduce the number of inter-substrate connection portions that connect the first substrate to the second substrate, and to easily manufacture a solid-state image pickup device in which both of a high S/N ratio and a wide dynamic range are achieved. Thus, in the mode for carrying out the present invention, it is possible to reduce a chip area (mounting area) of the solid-state image pickup device and to miniaturize the solid-state image pickup device.

Further, in each unit pixel of the solid-state image pickup device according to the mode for carrying out the present invention, the output (reading) in the first output mode for outputting the pixel signal with a wide dynamic range and the output (reading) in the second output mode for outputting the pixel signal with a high S/N ratio can be switched in succession. Accordingly, the solid-state image pickup device according to the mode for carrying out the present invention, it is possible to sum the pixel signal with a wide dynamic range and the pixel signal with a high S/N ratio and acquire a higher quality image in which the wide dynamic range and the high S/N ratio are simultaneously realized within one image.

In this embodiment, while only the first-mode constant current source transistor M10, the first-mode constant current source enable switch M9, the second-mode constant current source transistor M7, and the second-mode constant current source enable switch M8 have been shown as the components of the reading section 53, the configuration of the reading section 53 is not limited to the mode tor carrying out the present invention. For example, the configuration may be a configuration in which the summing circuit described above, or a sample and hold circuit that samples and holds the pixel signal output by the pixel section 51 at a predetermined timing is included.

Further, in this embodiment, the configuration in which the first-mode ground potential supply transistor M11 and the second-mode ground potential supply transistor M12 which are components of the ground potential controller 52 are shared by the plurality of unit pixels 50 arranged in the same row in the pixel array unit 40, that is, one ground potential controller 52 is included in each row of the pixel array unit 40 has been, described. However, the pixel section 51 to which one ground potential controller 52 corresponds is not limited to the mode for carrying out the present invention. For example, a configuration in which one ground potential controller 52 is included for a plurality of rows of the pixel array unit 40 may be adopted. Further, a configuration in which the ground potential controller 52 is shared by a predetermined range of pixel sections 51 arranged in the pixel array unit 40, that is, the pixel sections 51 in the pixel array unit 10 are divided into predetermined blocks, and one ground potential controller 52 is included for one block may be adopted.

Further, the configuration in which the pixel section 51 and the reading section 53 are connected on a one-to-one basis via the inter-substrate connection portion 54 has been described in this embodiment. However, a relationship between the pixel section 51 and the reading section 53 is not limited to the mode for carrying out the present invention. For example, a configuration in which one reading section 53 is included for a plurality of pixel sections 51 may be adopted.

Further, while the case in which the unit pixel 50 is read once in each of the first output mode and the second output mode at the driving timing illustrated in FIG. 8A has been described in this embodiment, the driving method for outputting both the pixel signal with a wide dynamic range and the pixel signal with a high S/N ratio corresponding to the signal charge that is generated by the photodiode PD through one exposure is not limited to the method described in the mode for carrying out the present invention. For example, a driving method in which the unit pixel 50 is read by a plurality of times in the first output mode and the second output mode so as to output both of the pixel signal with a wide dynamic range and the pixel signal with a high S/N ratio may be adopted.

Further, while a fixed rate at which the signal charge generated by the photodiode PD in the first output mode is transferred to the floating diffusion layer FD is set to $1/A_{CL}$ has been described in the description of the driving timing illustrated in FIG. 8A in this embodiment, the fixed rate is not necessarily limited to the fixed rate described in the mode for carrying out the present invention.

Further, in this embodiment, the configuration in which the components of the respective unit pixels 50 are divided and arranged in the first substrate and the second substrate, and the components arranged in the first substrate and the components arranged in the second substrate are connected by the inter-substrate connection portion 54 have been described. That is, the case in which the solid-state image pickup device 1 has a stacked configuration has been described. However, in the unit pixel 50 of this embodiment, the effect that makes it possible to reduce the number of pixel output signal terminals OUT to 1 while having the same function as that of the conventional low-noise flexible pixel 8 is not necessarily an effect for only the stacked solid-state image pickup device, but is an effect effective even in a solid-state image pickup device that is not stacked, that is, is manufactured using one substrate. That is, it is possible to obtain an effect that makes it possible to reduce the number of wirings in the solid-state image pickup device from two to one.

Further, the function of the unit pixel 50 capable of outputting the pixel signal with a wide dynamic range and the pixel signal with a high S/N ratio front one pixel output signal terminal OUT by performing the output (reading) of the pixel signal in the second output mode for realizing a high S/N ratio, subsequent to the output (reading) of the pixel signal in the first output mode for realizing the wide dynamic range is not a function necessarily required for only a stacked solid-state image pickup device, but is a function effective even in a solid-state image pickup device manufactured using one substrate. An effect that a high-quality image in which a wide dynamic range and a high S/N ratio are achieved can be acquired even when a bright region and a dark region exist within one view angle by illuminating the pixel signal with a wide dynamic range and the pixel signal with a high S/N ratio is an effect effective even in the solid-state image pickup device manufactured using one substrate.

Further, a circuit configuration, and a specific configuration of a driving method in the present invention are not limited to the mode for carrying out the present invention, and various modifications can be made without departing from the spirit of the present invention. For example, even when a component or a circuit configuration of the solid-state image pickup device or the unit pixel is changed due to a change in a circuit element or a driving method For the unit pixel or when the method of controlling the unit pixel using the vertical scanning circuit is changed, the concept of the present invention can be applied according to the changed driving method or controlling method.

A modification example of the circuit configuration of the unit pixel 50 according to the present invention will be described here. In this embodiment, the configuration of the unit pixel 50 in which both of the same high S/N ratio and the same wide dynamic range as those in the conventional low-noise flexible pixel 8 as illustrated in FIG. 12A are achieved by only adding one transistor to the conventional 4-transistor APS pixel 7 as illustrated in FIG. 11A has been described. However, in the unit pixel 50, it is possible to reduce the number of the components in the pixel section 51.

First Modification Example

Figure 9:
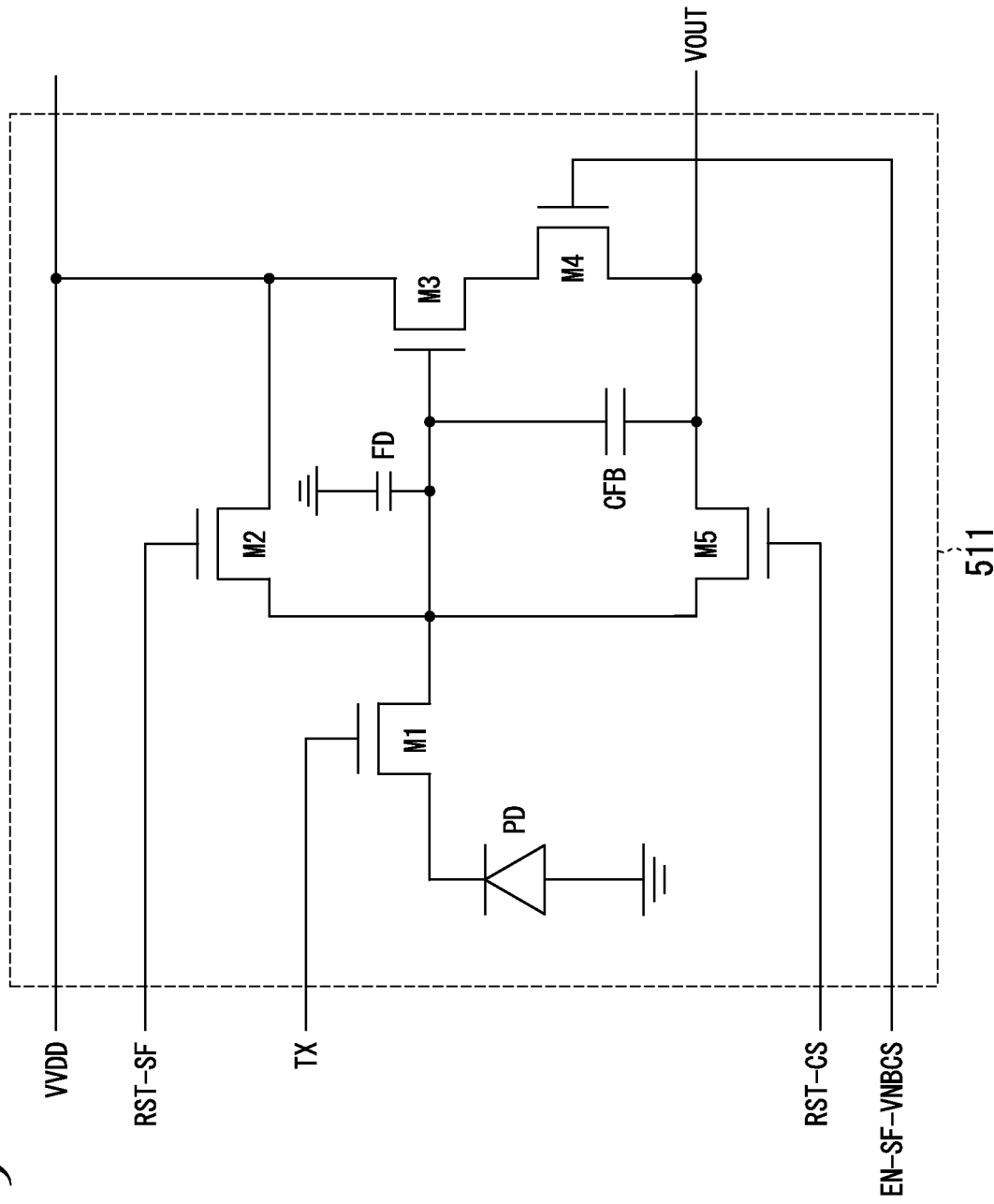
FIG. 9 is a circuit diagram illustrating a schematic configuration of a first modification example in the unit pixel in the pixel array unit of the solid-state image pickup device of this embodiment.

FIG. 9 is a circuit diagram illustrating a schematic configuration of a first modification example in the unit pixel 50 in the pixel array unit 40 of the solid-state image pickup device 1 in this embodiment. FIG. 9 illustrates a configuration of a pixel section 511 in which the second-mode feedback capacitor control M6 is removed from the pixel section 51 included in the unit pixel 50.

In the unit pixel 50, the second-mode feedback capacitor CFB requires capacitance below 1f[F], and is realized using the parasitic capacitance between the metal wirings that form the unit pixel, the overlap capacitance of the transistor, or the like, as described above. That is, the capacitance of the second-mode feedback capacitor CFB is fabricated to be sufficiently smaller than the overlap capacitance between the gate and the drain of the amplification transistor M3. Therefore, in the pixel section 511 illustrated in FIG. 9, it is possible to realize the same function and performance as those in the pixel section 51 even without the second-mode feedback capacitor control transistor M6 included in the pixel section 51.

With the removal of the second-mode feedback capacitor control transistor M6 in the pixel section 511, it is not necessary for the vertical scanning circuit 20 to perform the control of the second-mode enable signal EN-CS.

Second Modification Example

Figure 10:
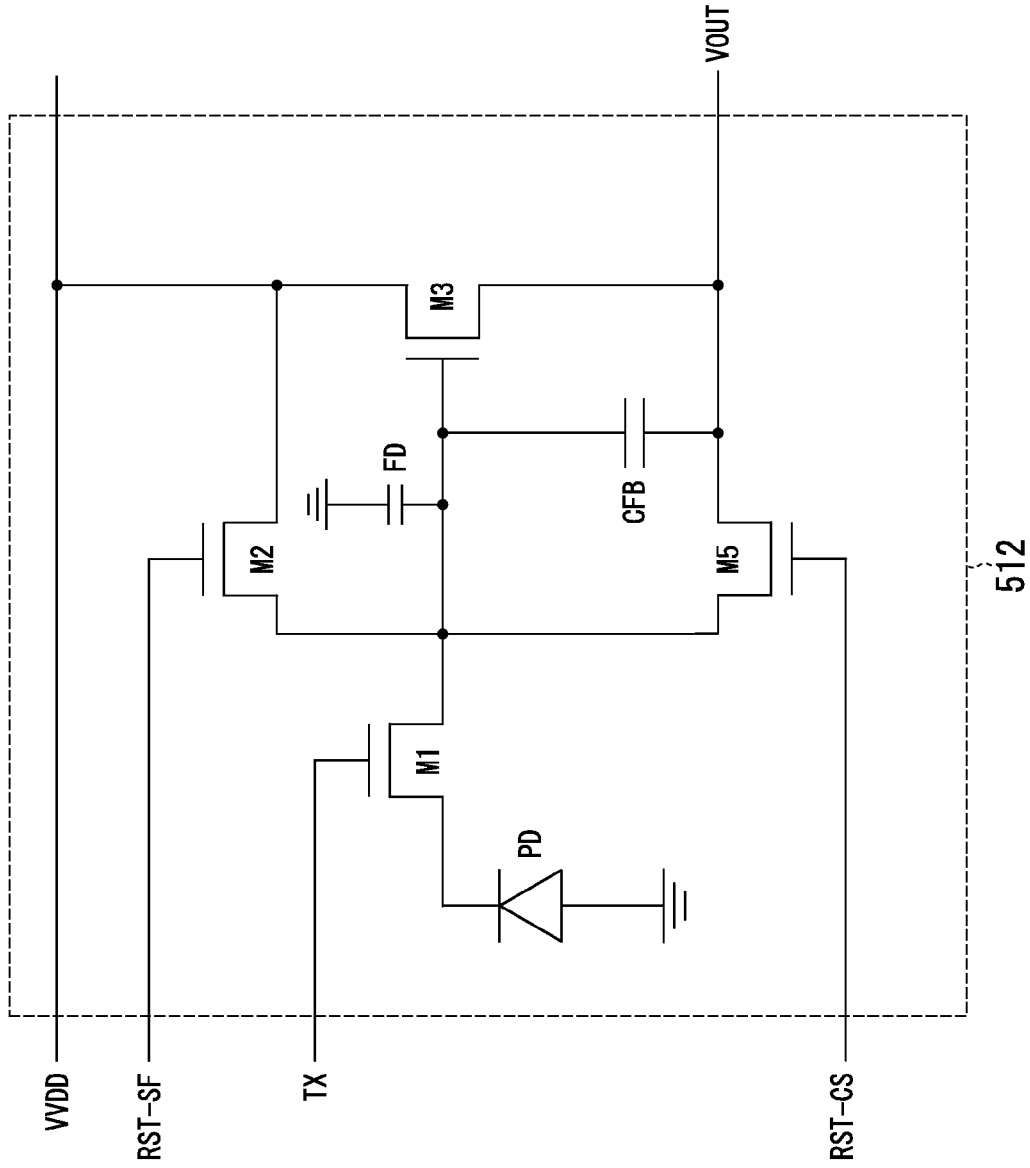
FIG. 10 is a circuit diagram illustrating a schematic configuration of a second modification example in the unit pixel in the pixel array and of the solid-state image pickup device of this embodiment.

FIG. 10 is a circuit diagram illustrating a schematic configuration of a second modification example in the unit pixel 50 in the pixel array unit 40 of the solid-state image pickup device a of this embodiment. FIG. 10 illustrates a configuration of the pixel section 512 in which the second-mode cascode transistor M4 is further removed from the pixel section 511 illustrated in FIG. 9, that is, the second-mode feedback capacitor control transistor M6 and the second-mode cascode transistor M4 are removed from the pixel section 51 included in the unit pixels 50. Since the reason for the removal of the second-mode feedback capacitor control transistor M6 from the unit pixels 50 are the same as the above-described reason, detailed description thereof will be omitted.

In the unit pixel 50, the second-mode cascode transistor M4 realizes a cascode circuit (common gate-grounded amplification circuit) for multiplying an open loop low-frequency gain of the amplification transistor M3. Accordingly, potential variation of the floating diffusion layer FD after the signal charge generated by the photodiode PD is transferred can be detected more sensitively.

However, when linearity of the output of the pixel signal required tor a general unit pixel can be ensured only by the amplification transistor M3, it is possible to realize the same function and performance as in the pixel section 51 even without the second-mode cascode transistor M4 included in the pixel section 51, as in the configuration of the pixel section 512 illustrated in FIG. 10.

With the removal of the second-mode feedback capacitor control transistor M6 and the second-mode cascode transistor M4 in the pixel section 512, it is not necessary for the vertical scanning circuit 20 to perform control of the second-mode enable signal EN-CS and the switching signals EN-SF-VNBCS.

The arrangement of the unit pixels in a row direction and a column direction is not limited to the mode for carrying out the present invention, and the number of unit pixels arranged in the row and column directions can be changed without departing from the spirit of the present invention.

Further, while the embodiment of the present invention has been described with reference to the drawings, a specific configuration is not limited to this embodiment, and various modifications without departing from the spirit of the present invention may be included.

Further, in the solid-state image pickup device according to the embodiment of the present invention, two substrates may be connected by the connection portion, or three or more substrates may be connected by the connection portion. In the case of a solid-state image pickup device in which the three or more substrates may be connected by the connection portion, two of the substrates correspond to the first substrate and the second substrate according to the claims.

Each aspect of the present invention can be widely applied to a solid-state image pickup device, and it is possible to achieve both of a high S/N ratio and a wide dynamic range, and acquire an image with a high S/N ratio and an image with a wide dynamic range through the same exposure.

What is claimed is:

1. A solid-state image pickup device having a first substrate and a second substrate in which circuit elements constituting pixels are arranged, the first substrate and the second substrate being electrically connected to each other by a connection portion,
wherein the pixel includes:
a pixel section that is arranged in the first substrate and includes a photoelectric conversion element that generates signal charge corresponding to incident light;
a ground potential controller that is arranged in the first substrate and switches a potential to which a circuit element included in the pixel section is grounded; and
a reading section that is arranged in the second substrate and outputs a signal, which corresponds to the signal charge generated by the photoelectric conversion element that is output from the pixel section, as a pixel signal output by the pixel, the pixel section includes:
- the photoelectric conversion element;
- an amplification transistor that outputs an amplification signal amplified according to the signal charge generated by the photoelectric conversion element; and
- a switch circuit that switches a ground of the amplification transistor according to a first output mode in which the amplification signal amplified by the amplification transistor being source-grounded is output to the reading section, and a second output mode in which the amplification signal amplified by the amplification transistor being drain-grounded is output to the reading section, and the ground potential controller supplies a first potential to the amplification transistor in the first output mode and supplies a second potential to the amplification transistor in the second output mode to switch a potential to which the amplification transistor is grounded.

2. The solid-state image pickup device according to claim 1,
wherein a plurality of pixel sections are arranged in a two-dimensional matrix form,
a predetermined number of the pixel units constitute each of a plurality of pixel unit groups, and
the ground potential controller includes:
- a first power supply that outputs the first potential;
- a second power supply that outputs the second potential;
- a plurality of first ground potential supply transistors each of which corresponds to each pixel unit group and supplies the first potential output by the first power supply to each amplification transistor included in each of the plurality of pixel units included in the corresponding pixel unit group; and
- a plurality of second ground potential supply transistors each of which corresponds to each pixel unit group and supplies the second potential output by the second power supply to each amplification transistor included in each of the plurality of pixel units included in the corresponding pixel unit group.

3. The solid-state image pickup device according to claim 2,
wherein each pixel section group includes a plurality of pixel sections arranged in the same row.

4. The solid-state image pickup device according to claim 1,
wherein the reading section sums the amplification signal output from the pixel section in the first output mode and the amplification signal output from the pixel section in the second output mode.

5. A solid-state image pickup device comprising:
- a pixel section including a photoelectric conversion element that generates signal charge corresponding to incident light;
- a ground potential controller that switches a potential to which a circuit element included in the pixel section is grounded; and
- a reading section that outputs a signal corresponding to the signal charge generated by the photoelectric conversion element that is output from the pixel section, as a pixel signal, wherein the pixel section includes:
- the photoelectric conversion element;
- an amplification transistor that outputs an amplification signal amplified according to the signal charge generated by the photoelectric conversion element; and
- a switch circuit that switches a ground of the amplification transistor according to a first output mode in which the amplification signal amplified by the amplification transistor being source-grounded is output to the reading section, and a second output mode in which the amplification signal amplified by the amplification transistor being drain-grounded is output to the reading section, the ground potential controller supplies a first potential to the amplification transistor in the first output mode and supplies a second potential to the amplification transistor in the second output mode to switch a potential to which the amplification transistor is grounded, and the reading section sums the amplification signal output from the pixel section in the first output mode and the amplification signal output from the pixel section in the second output mode.

* * * * *